United States Patent
Choo et al.

(10) Patent No.: US 10,193,562 B2
(45) Date of Patent: Jan. 29, 2019

(54) DIGITAL PHASE LOCKED LOOP CIRCUIT ADJUSTING DIGITAL GAIN TO MAINTAIN LOOP BANDWIDTH UNIFORMLY

(71) Applicant: Samsung Electronics Co., Ltd., Suwon-si, Gyeonggi-do (KR)

(72) Inventors: Kangyeop Choo, Seoul (KR); Wonsik Yu, Anyang-si (KR); Wooseok Kim, Suwon-si (KR); Jihyun Kim, Hwaseong-si (KR); Taeik Kim, Seongnam-si (KR); Hyunik Kim, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/802,601

(22) Filed: Nov. 3, 2017

(65) Prior Publication Data

US 2018/0367154 A1  Dec. 20, 2018

(30) Foreign Application Priority Data

Jun. 19, 2017 (KR) .......................... 10-2017-0077428

(51) Int. Cl.
*H03D 3/24* (2006.01)
*H03L 7/107* (2006.01)
(Continued)

(52) U.S. Cl.
CPC ............ *H03L 7/1072* (2013.01); *H03L 7/087* (2013.01); *H03L 7/091* (2013.01); *H03L 7/0992* (2013.01); *H03L 7/18* (2013.01); *H03L 7/199* (2013.01)

(58) Field of Classification Search
CPC ..... H03L 7/1072; H03L 7/0992; H03L 7/199; H03L 7/18; H03L 7/087; H03L 7/091; H04N 5/12; H03D 3/241; H03B 5/1212
(Continued)

(56) References Cited

U.S. PATENT DOCUMENTS 4,107,624 A * 8/1978 Turner .................. H03D 3/241
                                                 329/326
2006/0139108 A1  6/2006 Steinbach et al.
(Continued)

OTHER PUBLICATIONS

Sungchun Jang, An Optimum Loop Gain Tracking All-Digital PLL Using Autocorrelation of Bang-Bang Phase-Frequency, Journal from IEEE Transactions on Circuits and Systems-II, Sep. 2015, 836-840, vol. 62, No. 9, IEEE Circuits and Systems Society.

*Primary Examiner* — Phuong Phu
(74) *Attorney, Agent, or Firm* — Harness, Dickey & Pierce, P.L.C.

(57) ABSTRACT

A digital phase locked loop circuit includes a phase frequency detector, a bandwidth calibrator, a digital loop filter, and a digital controlled oscillator. The phase frequency detector generates a first detection value and a second detection value of which each is associated with order between a phase of a reference signal and a phase of a fed-back signal. The bandwidth calibrator amplifies a signal level of the second detection value by a gain value to generate an amplified detection value, and adjusts the gain value based on the first detection value. The digital loop filter generates a digital code based on the amplified detection value. The digital controlled oscillator generates an output signal having a frequency which corresponds to the digital code. The fed-back signal is generated based on the output signal and is fed back to the phase frequency detector.

20 Claims, 16 Drawing Sheets

(51) Int. Cl.
*H03L 7/099* (2006.01)
*H03L 7/199* (2006.01)
*H03L 7/18* (2006.01)
*H03L 7/087* (2006.01)
*H03L 7/091* (2006.01)

(58) Field of Classification Search
USPC .................................................. 375/373–376
See application file for complete search history.

(56) References Cited

U.S. PATENT DOCUMENTS

| | | |
|---|---|---|
| 2006/0274199 A1* | 12/2006 | Satoh ........................ H04N 5/12 348/500 |
| 2010/0188158 A1 | 7/2010 | Ainspan et al. |
| 2010/0264993 A1 | 10/2010 | Wang et al. |
| 2011/0084741 A1 | 4/2011 | van de Beek |
| 2011/0148489 A1 | 6/2011 | August et al. |
| 2013/0113536 A1 | 5/2013 | Sfikas et al. |
| 2014/0062549 A1 | 3/2014 | Navid |
| 2015/0008961 A1 | 1/2015 | Kim et al. |
| 2017/0111009 A1* | 4/2017 | Chiu ..................... H03B 5/1212 |

\* cited by examiner

| CNT[10:0] | BW[4:0] |
|---|---|
| 0 0 0 0 1 1 1 1 1 1 0 | 0 0 0 0 1 |
| 0 0 0 0 1 1 1 1 1 1 1 | 0 0 0 0 1 |
| 0 0 0 1 0 0 0 0 0 0 0 | 0 0 0 1 0 |
| 0 0 0 1 0 0 0 0 0 0 1 | 0 0 0 1 0 |
| 0 0 0 1 0 0 0 0 0 1 0 | 0 0 0 1 0 |

# DIGITAL PHASE LOCKED LOOP CIRCUIT ADJUSTING DIGITAL GAIN TO MAINTAIN LOOP BANDWIDTH UNIFORMLY

CROSS-REFERENCE TO RELATED APPLICATIONS

The present application claims priority under 35 U.S.C. § 119 to Korean Patent Application No. 10-2017-0077428 filed on Jun. 19, 2017, in Korean Intellectual Property Office, the entire contents of which are hereby incorporated by reference.

TECHNICAL FIELD

Example embodiments of the present disclosure relate to an electronic circuit, and more particularly, relate to operations and configurations of a digital phase locked loop circuit.

DISCUSSION OF THE RELATED ART

In recent years, various kinds of electronic devices are being used. An electronic device performs its own functions according to operations of various electronic circuits included therein. As a unit size of a semiconductor process decreases and degree of integration of a semiconductor device increases, an operation voltage for an electronic circuit has become lower, and an amount of leakage current has increased. For this reason, an electronic circuit is being designed according to a digital design technique instead of an analog design technique.

A synchronous electronic circuit designed according to the digital design technique operates in response to a clock signal. The clock signal may be controlled accurately to determine an operation timing of the electronic circuit. A phase locked loop circuit is employed to control a phase and a frequency of the clock signal by synchronizing an external clock signal with an internal clock signal. Meanwhile, due to miniaturization of a semiconductor process, a digital phase locked loop circuit is replacing an analog phase locked loop circuit.

Some of digital phase locked loop circuits are being employed widely because of a simple circuit configuration. However, an output variation of the digital phase locked loop circuit may affect a loop bandwidth, and the loop bandwidth may be vulnerable to process-voltage-temperature (PVT) variation. When a characteristic of the digital phase locked loop circuit is degraded, it may be difficult to control the clock signal accurately.

SUMMARY

Example embodiments of the present disclosure may provide configurations and operations of a digital phase locked loop circuit which is capable of adjusting a digital gain to maintain a loop bandwidth uniformly.

In some example embodiments, a digital phase locked loop circuit may include a phase frequency detector, a bandwidth calibrator, a digital loop filter, and a digital controlled oscillator.

The phase frequency detector may generate a first detection value which is associated with order between a first phase of a reference signal and a second phase of a fed-back signal. The phase frequency detector may generate a second detection value from the first detection value in response to the reference signal. For a first reference time, a ratio of the number of first logic value of the first detection value to the number of second logic values of the first detection value may converge to 1:M (M being a real number which is greater than "1"). For a second reference time, a ratio of the number of first logic value of the second detection value to the number of second logic values of the second detection value may converges to 1:1.

The bandwidth calibrator may amplify a signal level of the second detection value by a gain value, and thus may generate an amplified detection value. The bandwidth calibrator may adjust the gain value based on the first detection value. The bandwidth calibrator may increase the gain value in response to a first logic value of the first detection value, and may decrease the gain value in response to a second logic value of the first detection value.

The digital loop filter may generate a digital code based on the amplified detection value. The digital controlled oscillator may generate an output signal having a frequency which corresponds to the digital code. The fed-back signal may be generated based on the output signal, and may be fed back to the phase frequency detector.

In the example embodiments, the bandwidth calibrator may adjust a digital gain for amplifying a detection value which is output from a phase frequency detector, depending on a characteristic of the fed-back signal. Adjusting the digital gain may compensate for variation of an operation gain of the phase frequency detector due to variation of the output signal and the fed-back signal. Accordingly, a loop bandwidth of the digital phase locked loop circuit may be maintained uniformly, and the digital phase locked loop circuit may operate stably.

BRIEF DESCRIPTION OF THE DRAWINGS

The above and other objects and features will become apparent from the following description with reference to the following figures, wherein like reference numerals refer to like parts throughout the various figures unless otherwise specified, and wherein.

DETAILED DESCRIPTION OF EXAMPLE EMBODIMENTS

Below, some example embodiments will be described in detail and clearly with reference to accompanied drawings such that those skilled in the art can easily implement the present disclosure.

Figure 1:
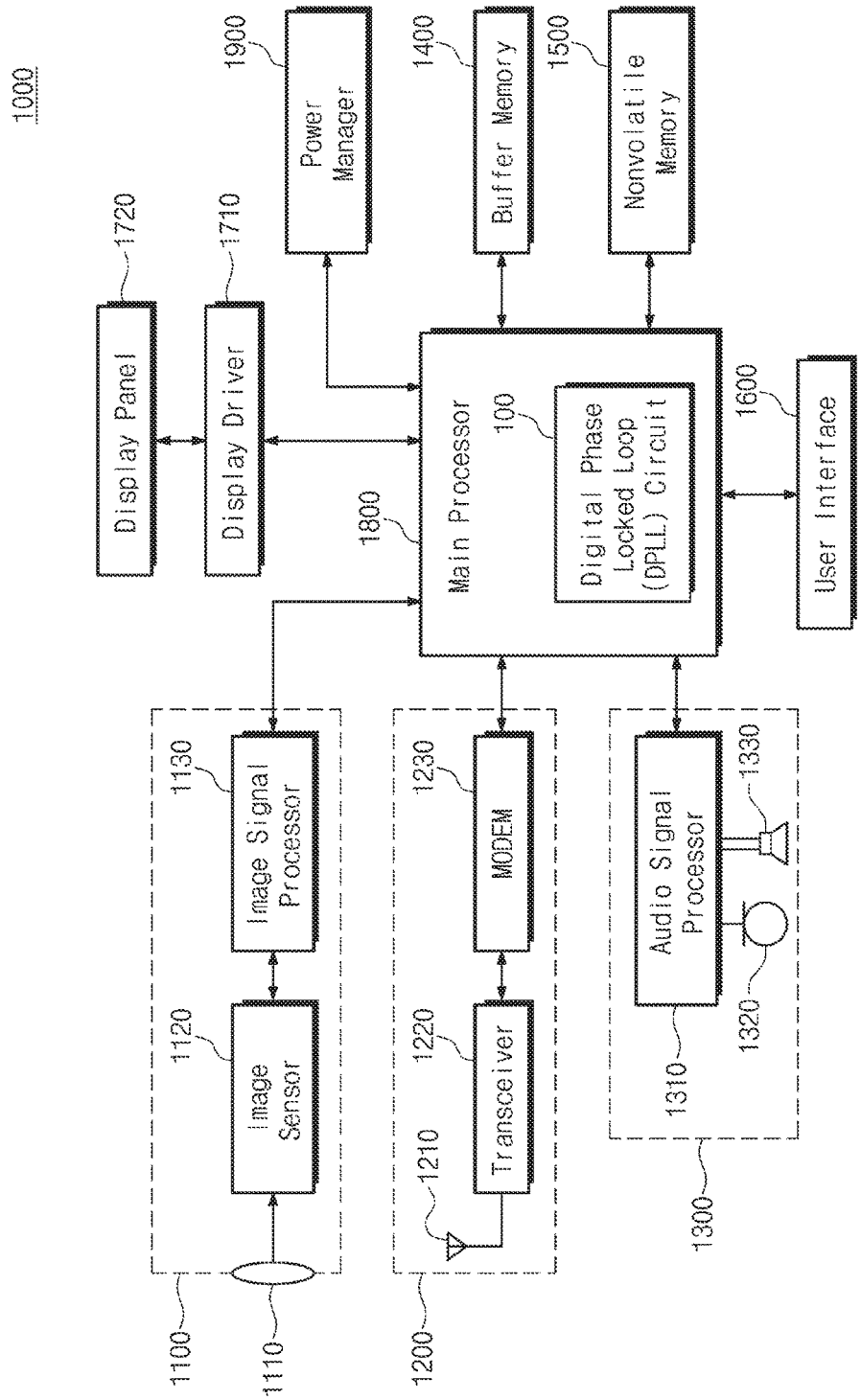
FIG. 1 is a block diagram illustrating an example configuration of an electronic device which includes an electronic circuit configured and operating according to some example embodiments.

FIG. 1 is a block diagram illustrating an example configuration of an electronic device 1000 which includes an electronic circuit configured and operating according to some example embodiments.

For example, the electronic device 1000 may be implemented with one of various types of electronic devices such as a smart phone, a tablet computer, a desktop computer, a laptop computer, a wearable device, a video game console, a workstation, a server, a home appliance, an electric vehicle, a medical device, and/or the like.

The electronic device 1000 may include various electronic circuits. For example, the electronic circuits of the electronic device 1000 may include an image processing block 1100, a communication block 1200, an audio processing block 1300, a buffer memory 1400, a nonvolatile memory 1500, a user interface 1600, a display driver 1710, a display panel 1720, a main processor 1800, and a power manager 1900.

The image processing block 1100 may receive light through a lens 1110. An image sensor 1120 and an image signal processor 1130 included in the image processing block 1100 may generate image information associated with an external object, based on the received light.

The communication block 1200 may exchange signals with an external device/system through an antenna 1210. A transceiver 1220 and a modulator/demodulator (MODEM) of the communication block 1200 may process signals exchanged with the external device/system, in compliance with a wireless communication protocol such as long term evolution (LTE), worldwide interoperability for microwave access (WIMAX), global system for mobile communication (GSM), code division multiple access (CDMA), Bluetooth, near field communication (NFC), wireless fidelity (Wi-Fi), radio frequency identification (RFID), and/or the like.

The audio processing block 1300 may process sound information by using an audio signal processor 1310, and thus may play and output audio. The audio processing block 1300 may receive an audio input through a microphone 1320. The audio processing block 1300 may output audio being played through a speaker 1330.

The buffer memory 1400 may store data to be used for an operation of the electronic device 1000. For example, the buffer memory 1400 may temporarily store data processed or to be processed by the main processor 1800. For example, the buffer memory 1400 may include a volatile memory such as a static random access memory (SRAM), a dynamic RAM (DRAM), a synchronous DRAM (SDRAM), and/or the like, and/or a nonvolatile memory such as a phase-change RAM (PRAM), a magneto-resistive RAM (MRAM), a resistive RAM (ReRAM), a ferroelectric RAM (FRAM), and/or the like.

The nonvolatile memory 1500 may store data regardless of power being supplied. For example, the nonvolatile memory 1500 may include at least one of various nonvolatile memories such as a flash memory, a PRAM, an MRAM, an ReRAM, an FRAM, and/or the like. For example, the nonvolatile memory 1500 may include a hard disk drive (HDD), a solid state drive (SSD), a removable memory such as a secure digital (SD) card, and/or an embedded memory such as an embedded multimedia card (eMMC).

The user interface 1600 may arbitrate communication between a user and the electronic device 1000. For example, the user interface 1600 may include input interfaces such as a keyboard, a mouse, a keypad, a button, a touch panel, a touch screen, a touch pad, a touch ball, a gyroscope sensor, a vibration sensor, an acceleration sensor, and/or the like. For example, the user interface 1600 may include output interfaces such as a motor, a light emitting diode (LED) lamp, and/or the like.

The display driver 1710 may drive the display panel 1720. The display panel 1720 may be driven by the display driver 1710 to display image information. For example, the display panel 1720 may include one or more of a liquid crystal display (LCD) device, an LED display device, an organic LED (OLED) display device, an active matrix OLED (AMOLED) display device, and/or the like.

The main processor 1800 may control overall operations of the electronic device 1000. The main processor 1800 may control/manage operations of components of the electronic device 1000. The main processor 1800 may process various operations to operate the electronic device 1000. For example, the main processor 1800 may be implemented with a general-purpose processor, a special-purpose processor, or an application processor.

The power manager 1900 may power components of the electronic device 1000. For example, the power manager 1900 may suitably convert power which is received from a battery and/or an external power source, and may transfer the converted power to components of the electronic device 1000.

However, example components illustrated in FIG. 1 are provided to facilitate better understanding, and are not intended to limit the present disclosure. The electronic device 1000 may not include one or more of components illustrated in FIG. 1, or may further include at least one component which is not illustrated in FIG. 1.

Meanwhile, the main processor 1800 may include various electronic circuits to perform its own functions. For example, the main processor 1800 may include a digital phase locked loop (DPLL) circuit 100. The DPLL circuit 100 may control a phase and a frequency of a clock signal by synchronizing an external clock signal with an internal clock signal. The main processor 1800 may operate in response to a clock signal which is output from the DPLL circuit 100. Example configurations and example operations of the DPLL circuit 100 will be described with reference to FIGS. 2 to 20.

FIG. 1 illustrates that the main processor 1800 includes the DPLL circuit 100, but the present disclosure is not limited to illustration of FIG. 1. Any component other than the main processor 1800 may include the DPLL circuit 100. For example, each of the MODEM 1230, the buffer memory 1400, the nonvolatile memory 1500, and the display driver 1710 may include a DPLL circuit which is substantially the same as or similar to the DPLL circuit 100, and may operate in response to a clock signal which is output from the DPLL circuit. It will be understood that example embodiments to be described below may be employed for any component other than the main processor 1800.

Figure 2:
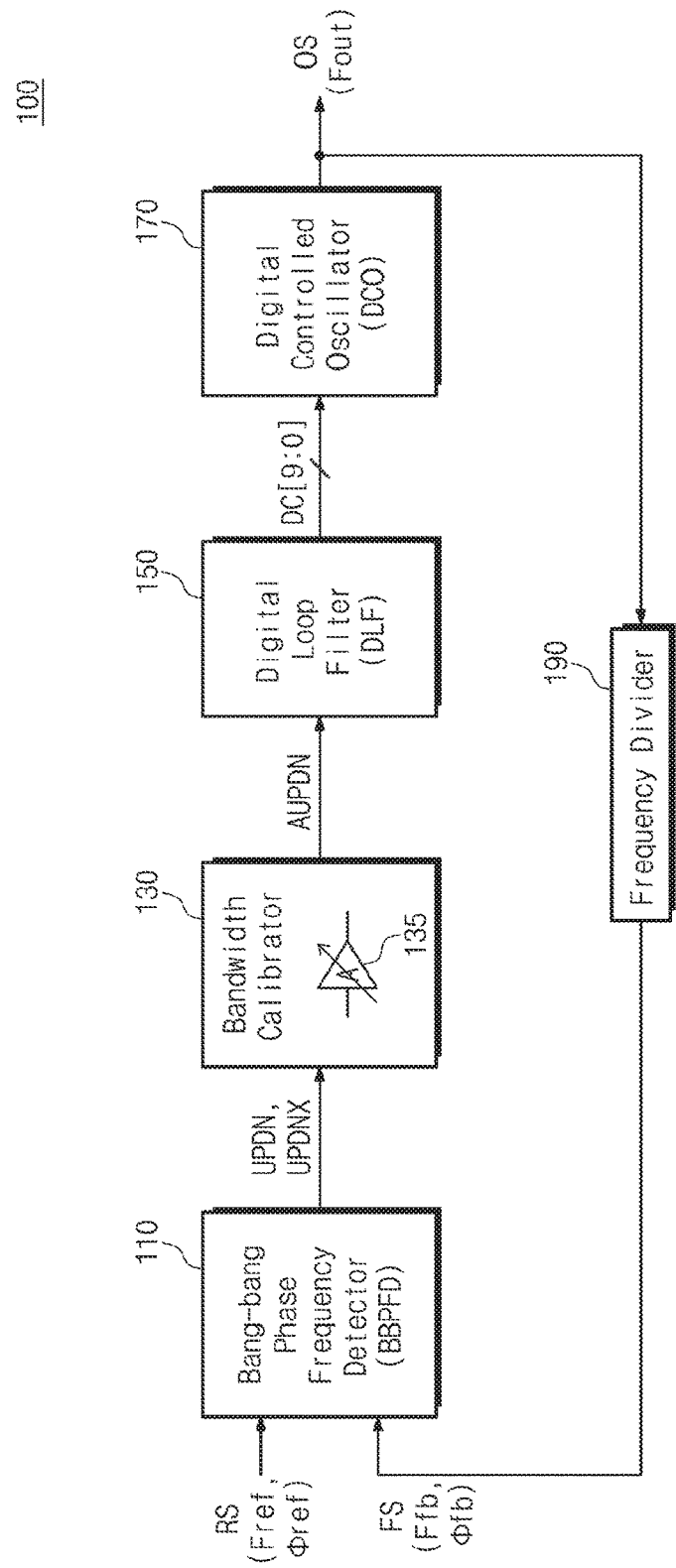
FIG. 2 is a block diagram illustrating an example configuration of a digital phase locked loop circuit of FIG. 1.

FIG. 2 is a block diagram illustrating an example configuration of the DPLL circuit 100 of FIG. 1.

In some example embodiments, the DPLL circuit 100 may include a bang-bang phase frequency detector (BBPFD) 110, a bandwidth calibrator 130, a digital loop filter (DLF) 150, and a digital controlled oscillator (DCO) 170.

The BBPFD 110 may receive a reference signal RS and a fed-back signal FS. The BBPFD 110 may generate detection values UPDN and UPDNX based on the reference signal RS and the fed-back signal FS.

The reference signal RS may be received according to a frequency Fref and a phase Φref, and the fed-back signal FS may be received according to a frequency Ffb and a phase φfb. For example, each of the reference signal RS and the fed-back signal FS may correspond to, but is not limited to, a clock signal. The reference signal RS and the fed-back signal FS may be any kind of signals which have characteristics of a frequency and a phase. For example, when the reference signal RS corresponds to a clock signal, the reference signal RS may be received from a reference clock generator outside the DPLL circuit 100.

The BBPFD 110 may generate the detection value UPDNX based on a difference between the phase Φref of the reference signal RS and the phase Φfb of the fed-back signal FS. The detection value UPDNX may be associated with order between the phase Φref of the reference signal RS and the phase Φfb of the fed-back signal FS.

For example, when the phase Φref lags behind the phase Φfb, the detection value UPDNX may have a first logic value (e.g., logic "0"). For example, when the phase Φref leads the phase Φfb, the detection value UPDNX may have a second logic value (e.g., logic "1"). However, these examples are provided to facilitate better understanding, and are not intended to limit the present disclosure. The logic values of the detection value UPDNX may be changed or modified depending on a design of the BBPFD 110.

Meanwhile, the BBPFD 110 may generate the detection value UPDN based on the reference signal RS and the detection value UPDNX. Accordingly, the detection value UPDN may also be associated with the order between the phase Φref of the reference signal RS and the phase Φfb of the fed-back signal FS. An example configuration and operation of the BBPFD 110 for generating the detection values UPDN and UPDNX will be described with reference to FIGS. 13 to 15.

For example, when the BBPFD 110 is employed, each of the detection values UPDN and UPDNX may include one bit of a logic value which indicates the order between the phase Φref of the reference signal RS and the phase Φfb of the fed-back signal FS, and may not indicate quantity of a difference between the phase Φref of the reference signal RS and the phase Φfb of the fed-back signal FS. Herein, FIG. 1 illustrates that the DPLL circuit 100 includes the BBPFD 110, but the present disclosure is not limited to illustration of FIG. 1. In some example embodiments, the DPLL circuit 100 may include other type of a phase frequency detector or a phase detector other than the BBPFD 110.

The detection value UPDNX may be generated before the detection value UPDN is generated, and may also be referred to as a first detection value or an intermediate detection value. The detection value UPDN may be generated after the detection value UPDNX is generated, and may also be referred to as a second detection value or a final detection value.

The bandwidth calibrator 130 may receive the detection values UPDN and UPDNX. The bandwidth calibrator 130 may include an amplifier 135. The bandwidth calibrator 130 may amplify a signal level of the detection value UPDN by a gain value, using the amplifier 135, and thus may generate an amplified detection value AUPDN.

The bandwidth calibrator 130 may adjust the gain value of the amplifier 135. For example, the bandwidth calibrator 130 may adjust the gain value of a digital gain for the detection value UPDN, based on the detection value UPDNX. For example, the bandwidth calibrator 130 may increase the gain value in response to the first logic value of the detection value UPDNX, and may decrease the gain value in response to the second logic value of the detection value UPDNX.

An example configuration and operation of the bandwidth calibrator 130 for adjusting the digital gain for the detection value UPDN based on the detection value UPDNX will be described with reference to FIGS. 16 to 19. In addition, compensating for variation of an operation gain of the BBPFD 110 by adjusting the digital gain for the detection value UPDN will be described with reference to FIGS. 3 to 12.

The DLF 150 may receive the amplified detection value AUPDN. The DLF 150 may generate a digital code DC[9:0] based on the amplified detection value AUPDN. Herein, the 10-bit digital code DC[9:0] is provided as an example, but the present disclosure is not limited thereto. A length of a bit string of the digital code may be changed or modified depending on a design of the DPLL circuit 100.

The DCO 170 may receive the digital code DC[9:0]. The DCO 170 may generate an output signal OS based on the digital code DC[9:0]. The output signal OS may have a frequency Fout which corresponds to the digital code DC[9:0]. Accordingly, the frequency Fout of the output signal OS may also be associated with the amplified detection value AUPDN and the detection value UPDN.

The output signal OS may be used in an electronic circuit or an electronic device which includes the DPLL circuit 100. For example, when the main processor 1800 of FIG. 1 includes the DPLL circuit 100, the output signal OS may be used as a clock signal for operating the main processor 1800. The output signal OS may be provided to other electronic circuit which operates in response to a clock signal.

In some example embodiments, the DPLL circuit 100 may further include a frequency divider 190. The frequency divider 190 may receive the output signal OS. The frequency divider 190 may divide the output signal OS to generate the fed-back signal FS. Accordingly, the fed-back signal FS may be generated based on the output signal OS, and may be fed back to the BBPFD 110.

The BBPFD 110, the bandwidth calibrator 130, the DLF 150, the DCO 170, and the frequency divider 190 may constitute a loop path in the DPLL circuit 100. In other words, the loop path of the DPLL circuit 100 may include, for example, all or some of the BBPFD 110, the bandwidth calibrator 130, the DLF 150, the DCO 170, and the frequency divider 190.

When a band of the frequency Fout of the output signal OS is significantly different from a band of the frequency Fref of the reference signal RS, the frequency divider 190 may be employed to divide the frequency Fout suitably. On the other hand, in some example embodiments, when the band of the frequency Fout of the output signal OS is almost the same as the band of the frequency Fref of the reference signal RS, the DPLL circuit 100 may not include the frequency divider 190. In such example embodiments, the output signal OS may be fed back to the BBPFD 110 as the fed-back signal FS without frequency dividing.

The DPLL circuit 100 may adjust the frequency Fout of the output signal OS depending on the order between the phase Φref of the reference signal RS and the phase Φfb of the fed-back signal FS. For example, when the frequency Fref of the reference signal RS is lower than the frequency Ffb of the fed-back signal FS and the phase Φref lags behind the phase Φfb (i.e., when the fed-back signal FS is faster than the reference signal RS), the DPLL circuit 100 may decrease the frequency Fout. To this end, the detection value UPDN and the amplified detection value AUPDN may be generated to decrease the frequency Fout, and the digital code DC[9:0] may decrease in order to decrease the frequency Fout. Accordingly, the frequency Ffb may also decrease.

On the other hand, when the frequency Fref of the reference signal RS is higher than the frequency Ffb of the fed-back signal FS and the phase Φref leads the phase Φfb (i.e., when the fed-back signal FS is slower than the reference signal RS), the DPLL circuit 100 may increase the frequency Fout. To this end, the detection value UPDN and the amplified detection value AUPDN may be generated to increase the frequency Fout, and the digital code DC[9:0] may increase in order to increase the frequency Fout. Accordingly, the frequency Ffb may also increase.

When the fed-back signal FS approaches the reference signal RS according to the above-described manner, the phase Φfb and the frequency Ffb of the fed-back signal FS may be locked within a specific range. Accordingly, the DPLL circuit 100 may precisely control the frequency Fout of the output signal OS.

The DPLL circuit 100 may include electronic circuits to perform its own functions. For example, the BBPFD 110, the bandwidth calibrator 130, the DLF 150, the DCO 170, and the frequency divider 190 may be implemented with various digital circuits to perform operations described above and to be described below, and may include one or more logic components and logic circuits.

Figure 3:
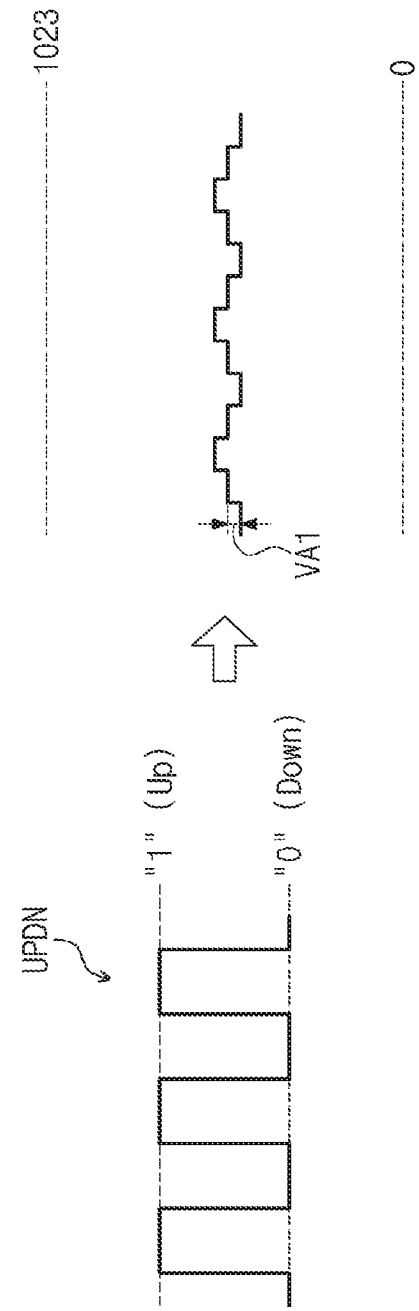
FIG. 3 is a conceptual diagram illustrating an example detection value and an example digital code in a case where a bandwidth calibrator is not connected to a digital phase locked loop circuit in FIG. 2.

FIG. 3 is a conceptual diagram illustrating an example detection value UPDN and an example digital code DC[9:0] in a case where the bandwidth calibrator 130 is not connected to the DPLL circuit 100 in FIG. 2.

Unlike illustration of FIG. 2, in some cases, the DPLL circuit 100 may not include the bandwidth calibrator 130. In this case, the detection value UPDN which is output from the BBPFD 110 may be provided to the DLF 150 without amplification. Accordingly, as illustrated in FIG. 3, the DLF 150 may generate the digital code DC[9:0] based on the detection value UPDN.

For example, the detection value UPDN may have a first logic value (e.g., logic "0") to decrease the frequency Fout of the output signal OS. On the other hand, the detection value UPDN may have a second logic value (e.g., logic "1") to increase the frequency Fout of the output signal OS.

For example, the 10-bit digital code DC[9:0] may have a value which is included in a range from 0 to 1023, and may increase or decrease based on the detection value UPDN. For example, the digital code DC[9:0] may decrease in response to the first logic value of the detection value UPDN, and may increase in response to the second logic value of the detection value UPDN. For example, the digital code DC[9:0] may increase or decrease by a magnitude VA1, in response to a logic value of the detection value UPDN.

The frequency Fout of the output signal OS may increase or decrease in response to an increase or decrease in the digital code DC[9:0].

Figure 4:
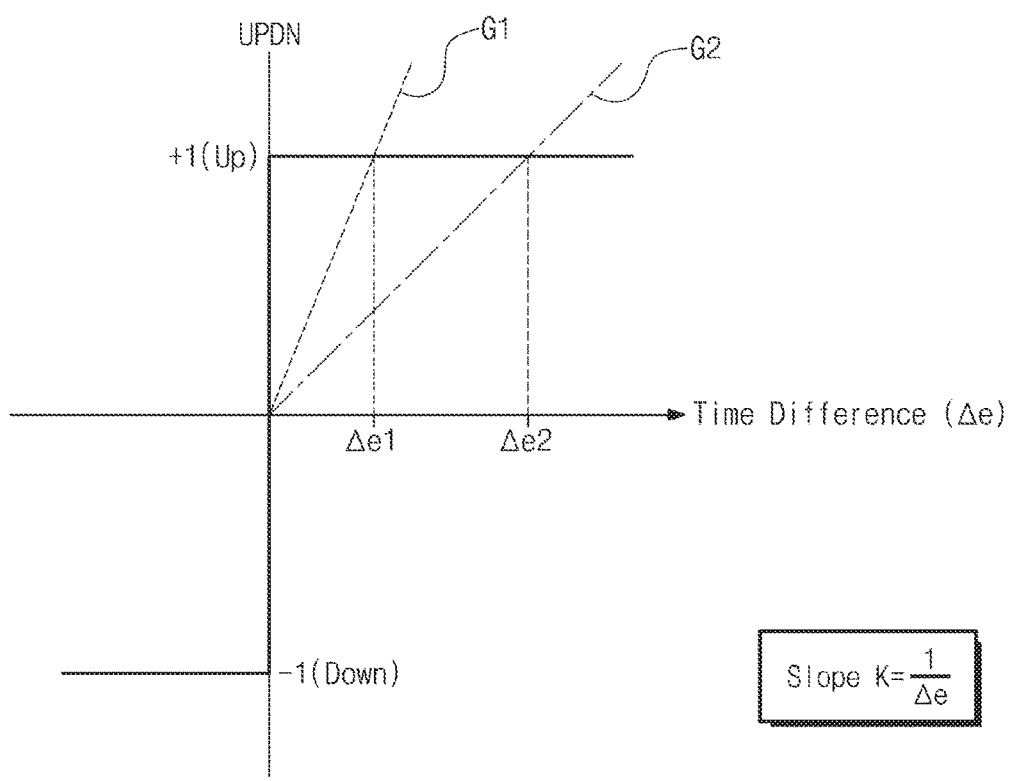
FIG. 4 is a graph for describing an example characteristic of a bang-bang phase frequency detector in a case where a bandwidth calibrator is not connected to a digital phase locked loop circuit in FIG. 2.
Figure 5:
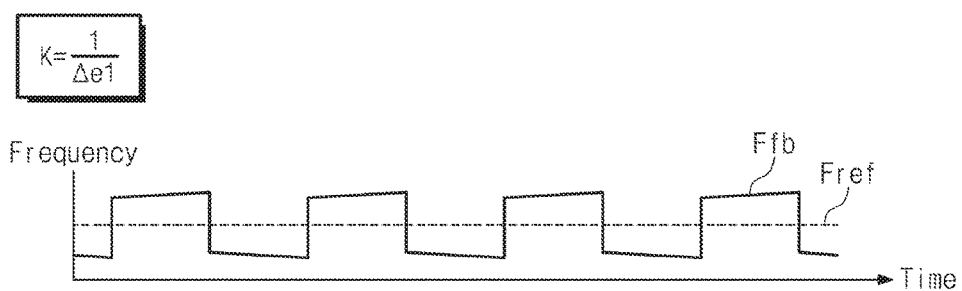
FIGS. 5 and 6 are conceptual diagrams illustrating an example reference signal and an example fed-back signal in FIG. 2.
Figure 6:
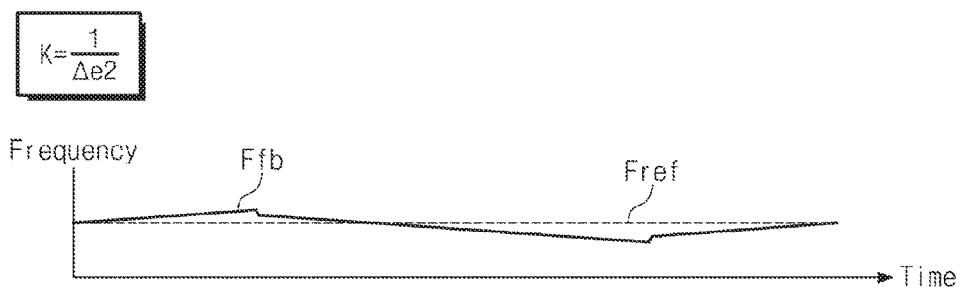

FIG. 4 is a graph for describing an example characteristic of the BBPFD 110 in the case where the bandwidth calibrator 130 is not connected to the DPLL circuit 100 in FIG. 2. FIGS. 5 and 6 are conceptual diagrams illustrating an example reference signal RS and an example fed-back signal FS in FIG. 2. To facilitate better understanding, FIGS. 4 to 6 will be described together.

Referring to FIG. 4, a horizontal axis of the graph may denote a time difference Δe between a time point where the reference signal RS is received in the BBPFD 110 and a time point where the fed-back signal FS is received in the BBPFD 110. A vertical axis of the graph may denote a logic value of the detection value UPDN which is generated by the BBPFD 110. As described above, when the DPLL circuit 100 does not include the bandwidth calibrator 130, the detection value UPDN may be handled without amplification.

In the example of FIG. 4, the detection value UPDN may include one bit of a logic value which indicates the order between the phase Φref of the reference signal RS and the phase Φfb of the fed-back signal FS. Accordingly, the detection value UPDN may have a first logic value and a second logic value with regard to the order between the phase Φref and the phase Φfb (similar to the detection value UPDNX which has been described with reference to FIG. 2), regardless of quantity of the time difference Δe. FIG. 4 illustrates that the detection value UPDN has values of "+1" and "−1" as the first logic value and the second logic value, but it should be understood that the values are not contradictory to the logic values illustrated in FIG. 3 and are just provided as an example to describe a characteristic of the BBPFD 110.

For example, when the time difference Δe is "Δe1", a graph G1 may be drawn from the origin. Meanwhile, when the time difference Δe is "Δe2", a graph G2 may be drawn from the origin.

A slope of each of the graphs G1 and G2 may be calculated as "1/Δe". The slope may be understood as an operation gain K of the BBPFD 110. The BBPFD 110 may receive inputs (e.g., the reference signal RS and the fed-back signal FS) during the time difference Δe to output the value of "+1", and thus the operation gain K of the BBPFD 110 may correspond to "1/Δe". The operation gain K of the BBPFD 110 may vary depending on the time difference Δe.

When the time difference Δe is "Δe1", the operation gain K of the BBPFD 110 may correspond to "1/Δe1". When the time difference Δe is "Δe2", the operation gain K of the BBPFD 110 may correspond to "1/Δe2". "Δe1" may be smaller than "Δe2", and thus "1/Δe1" may be greater than "1/Δe2". As will be described below, the operation gain K of the BBPFD 110 may affect variation of the frequency Ffb of the fed-back signal FS, and thus may affect a bandwidth of the DPLL circuit 100.

FIG. 5 illustrates variation of the frequency Ffb of the fed-back signal FS in a case where the time difference Δe is "Δe1", i.e., in a case where the operation gain K of the BBPFD 110 is "1/Δe1". On the other hand, FIG. 6 illustrates variation of the frequency Ffb of the fed-back signal FS in a case where the time difference Δe is "Δe2", i.e., in a case where the operation gain K of the BBPFD 110 is "1/Δe2".

As described above, when the fed-back signal FS approaches the reference signal RS, the frequency Ffb of the fed-back signal FS may be locked within a specific range. Referring to FIGS. 5 and 6, it may be understood that, while the frequency Fref of the reference signal RS is constant, the frequency Ffb of the fed-back signal FS varies in association with the operation gain K of the BBPFD 110 or the time difference Δe.

Referring to FIG. 5, when the operation gain K of the BBPFD 110 is relatively high, the frequency Ffb of the fed-back signal FS may vary quickly during a short time (e.g., during the time difference Δe1). Accordingly, an amount of variation of the frequency Ffb may be relatively great, and a speed of variation of the frequency Ffb may be fast.

On the other hand, referring to FIG. 6, when the operation gain K of the BBPFD 110 is relatively low, the frequency Ffb of the fed-back signal FS may vary slowly during a long time (e.g., during the time difference Δe2). Accordingly, an amount of variation of the frequency Ffb may be relatively small, and a speed of variation of the frequency Ffb may be slow. According to the above-described manner, the operation gain K of the BBPFD 110 may affect the variation of the frequency Ffb of the fed-back signal FS.

Meanwhile, as described above, the BBPFD 110, the bandwidth calibrator 130, the DLF 150, the DCO 170, and the frequency divider 190 may constitute a loop path in the DPLL circuit 100. This loop path may determine a bandwidth of the DPLL circuit 100.

When the amount of variation of the frequency Ffb of the fed-back signal FS is great as illustrated in FIG. 5, it may be understood as the bandwidth of the DPLL circuit 100 being great. On the other hand, when the amount of variation of the frequency Ffb of the fed-back signal FS is small as illustrated in FIG. 6, it may be understood as the bandwidth of the DPLL circuit 100 being small. As a result, the operation gain K of the BBPFD 110 may affect the bandwidth of the DPLL circuit 100.

FIGS. 7 to 10 are graphs for describing a bandwidth and a phase noise in the DPLL circuit 100 of FIG. 2. To facilitate better understanding, FIGS. 7 to 10 will be described together.

Referring to FIGS. 7 to 10, a horizontal axis of each graph may denote the frequency Ffb of the fed-back signal FS which is received in the BBPFD 110. A vertical axis of each graph may denote a phase noise between the phase Φref of the reference signal RS and the phase Φfb of the fed-back signal FS.

Figure 7:
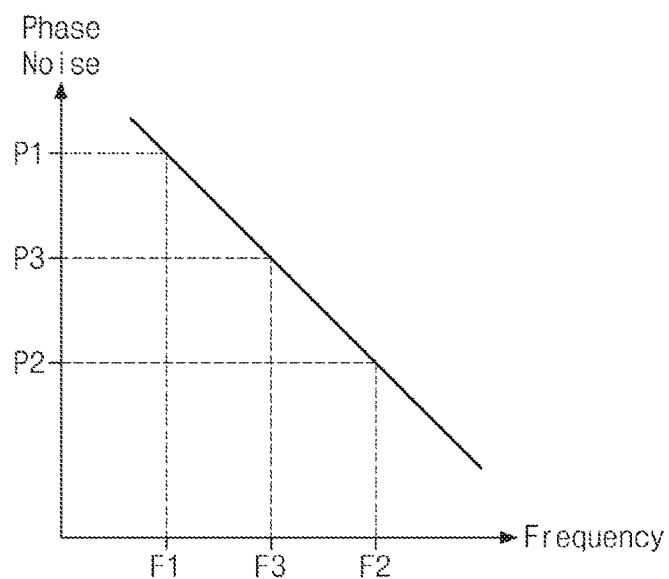
FIGS. 7 to 10 are graphs for describing a bandwidth and a phase noise in a digital phase locked loop circuit of FIG. 2.

The graph of FIG. 7 illustrates a relationship between a characteristic of the frequency Ffb and the phase noise. Referring to FIG. 7, it may be readily understood that a magnitude of the frequency Ffb is inversely proportional to a phase noise. The lower the frequency Ffb of the fed-back signal FS is, the greater the phase noise is. On the other hand, the higher the frequency Ffb of the fed-back signal FS is, the smaller the phase noise is.

For example, when the frequency Ffb is "F1", the phase noise may be "P1". On the other hand, when the frequency Ffb is "F2" which is higher than "F1", the phase noise may be "P2" which is smaller than "P1". Meanwhile, when the frequency Ffb is "F3" between "F1" and "F2", the phase noise may be "P3" between "P1" and "P2".

Figure 8:
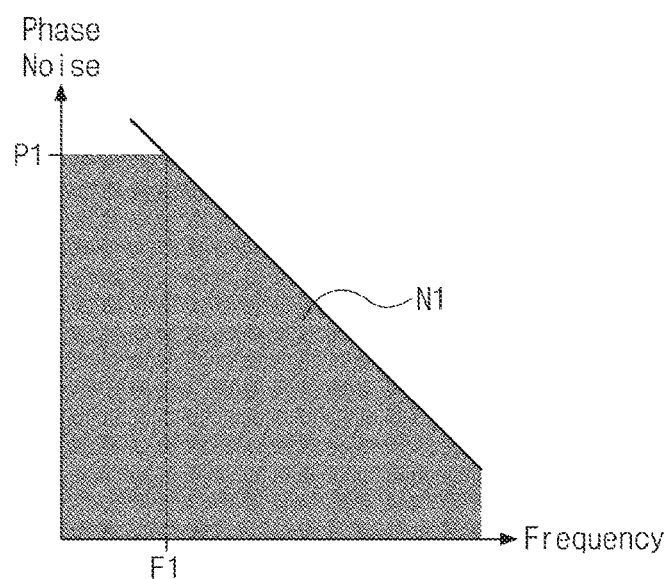

Accordingly, referring to FIG. 8, when the DPLL circuit 100 operates such that a bandwidth of the DPLL circuit 100 becomes "F1", an amount of the phase noise which is issued in the DPLL circuit 100 may be "N1". On the other hand, referring to FIG. 9, when the DPLL circuit 100 operates such that the bandwidth of the DPLL circuit 100 becomes "F2", the amount of the phase noise which is issued in the DPLL circuit 100 may be "N2". Herein, "N1" may correspond to an area below the graph associated with a case where the phase noise is equal to or less than "P1", and "N2" may correspond to an area below the graph associated with a case where the phase noise is equal to or less than "P2".

Figure 9:
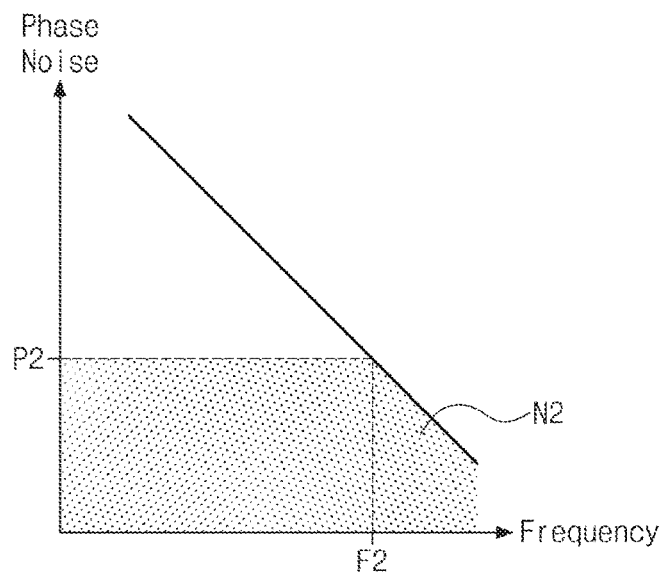

Comparing FIG. 8 with FIG. 9, "N1" may be greater than "N2". That is, the amount of the phase noise may decrease as the bandwidth of the DPLL circuit 100 becomes higher. Accordingly, it may be advantageous to increase the bandwidth of the DPLL circuit 100 in terms of the phase noise.

However, when the bandwidth of the DPLL circuit 100 is high, the amount of variation of the frequency Ffb of the fed-back signal FS may increase (refer to FIG. 5). Accordingly, when the bandwidth of the DPLL circuit 100 is excessively high, stability of an operation of the DPLL circuit 100 may be deteriorated. For this reason, it may be more advantageous to suitably control the bandwidth of the DPLL circuit 100 taking into account both the phase noise and the stability.

Figure 10:
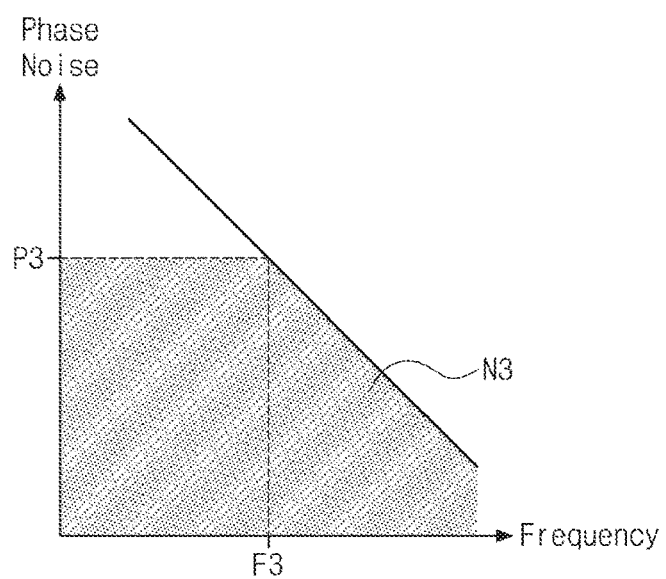

For example, referring to FIG. 10, the DPLL circuit 100 may operate such that the bandwidth of the DPLL circuit 100 becomes "F3". In this example, the amount of the phase noise which is issued in the DPLL circuit 100 may be "N3". Herein, "N3" may correspond to an area below the graph associated with a case where the phase noise is equal to or less than "P3". "N3" may be smaller than "N1", and may be greater than "N2".

"F3" is between "F1" and "F2", and thus "F3" may be provided as the bandwidth of the DPLL circuit 100 taking into account both the phase noise and the stability. "F3" may not be excessively great or excessively small, and thus may be regarded as an optimal bandwidth or a reference bandwidth of the DPLL circuit 100. It may be addressable to suitably control the bandwidth of the DPLL circuit 100 to operate the DPLL circuit 100 reliably and stably.

As can be understood from the above descriptions, the bandwidth of the DPLL circuit 100 may be affected by the operation gain K of the BBPFD 110. In addition, the operation gain K of the BBPFD 110 may be affected by the time difference Δe between a time point where the reference signal RS is received in the BBPFD 110 and a time point where the fed-back signal FS is received in the BBPFD 110. Accordingly, the bandwidth of the DPLL circuit 100 may be affected by the time difference Δe.

The time difference Δe may be based on the reference signal RS and the fed-back signal FS. However, transferring the reference signal RS and the fed-back signal FS may be affected by various factors (e.g., process-voltage-temperature (PVT) variation). For example, a change in an operation voltage or an operation temperature may affect transferring the reference signal RS and the fed-back signal FS, and thus may affect the time difference Δe.

As a result, the operation gain K of the BBPFD 110 and the bandwidth of the DPLL circuit 100 may be vulnerable to PVT variation. In some cases, even though the DPLL circuit 100 is designed to operate at an optimal bandwidth, an actual bandwidth of the DPLL circuit 100 may become higher or lower than the optimal bandwidth due to PVT variation. In this case, an operation of the DPLL circuit 100 may not be reliable or stable.

Accordingly, in some example embodiments, the DPLL circuit 100 may include the bandwidth calibrator 130. The bandwidth calibrator 130 may adjust the gain value of the digital gain for amplifying the detection value UPDN, depending on a characteristic of the fed-back signal FS. Adjusting the gain value of the digital gain may compensate for the variation of the operation gain K of the BBPFD 110 due to various factors (e.g., PVT variation).

For example, even though PVT variation affects the time difference Δe and the operation gain K of the BBPFD 110, an adjustable digital gain may make the bandwidth of the DPLL circuit 100 uniform. The bandwidth calibrator 130 may adjust the gain value of the digital gain such that the bandwidth of the DPLL circuit 100 is maintained uniformly. Accordingly, the DPLL circuit 100 may operate stably.

Figure 11:
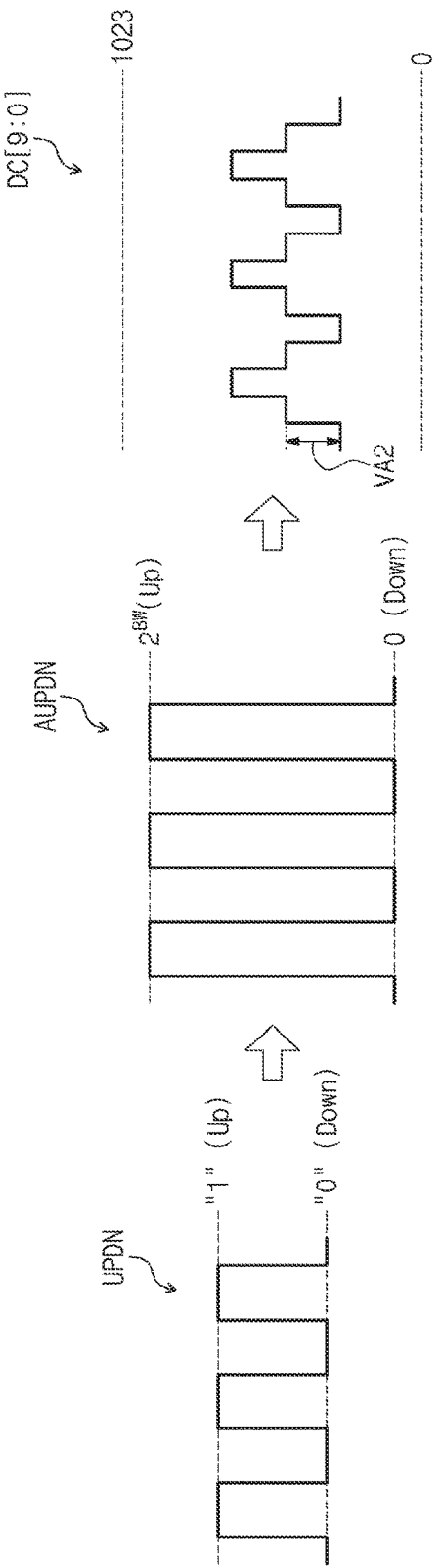
FIG. 11 is a conceptual diagram for describing an example operation of a bandwidth calibrator of FIG. 2

FIG. 11 is a conceptual diagram for describing an example operation of the bandwidth calibrator 130 of FIG. 2.

When the DPLL circuit 100 includes the bandwidth calibrator 130, a signal level of the detection value UPDN which is output from the BBPFD 110 may be amplified by a gain value $2^{BW}$, and thus the bandwidth calibrator 130 may generate the detection value AUPDN which is amplified by the amplifier 135. For example, when the detection value UPDN has a signal level of logic "1" to increase the frequency Fout of the output signal OS, a corresponding signal level of the amplified detection value AUPDN may become "$2^{BW}$".

The gain value $2^{BW}$ mentioned in the present disclosure is not intended to limit the present disclosure. The gain value may be variously changed or modified depending on a design of the DPLL circuit 100, and may be any adjustable value other than an exponent of 2. However, the exponent of 2 may be suitably employed due to a characteristic of a digital circuit, and thus the gain value $2^{BW}$ which is the exponent of 2 will be provided as an example for facilitating better understanding.

The amplified detection value AUPDN which is output from the bandwidth calibrator 130 may be provided to the DLF 150. As illustrated in FIG. 11, the DLF 150 may generate the digital code DC[9:0] based on the amplified detection value AUPDN. For example, the 10-bit digital code DC[9:0] may have a value which is included in a range from 0 to 1023, and may increase or decrease based on the amplified detection value AUPDN.

For example, the digital code DC[9:0] may decrease in response to a first logic value of the amplified detection value AUPDN, and may increase in response to a second logic value of the amplified detection value AUPDN. The frequency Fout of the output signal OS may increase or decrease in response to an increase or decrease in the digital code DC[9:0].

For example, the digital code DC[9:0] may increase or decrease by a magnitude VA2, in response to a logic value of the amplified detection value AUPDN. The magnitude VA1 of FIG. 3 is fixed, but the magnitude VA2 of FIG. 11 may be variable depending on the adjustable gain value $2^{BW}$. Accordingly, adjusting the gain value $2^{BW}$ may affect an amount of variation and speed of variation of the frequency Fout of the output signal OS, and may compensate for the variation of the operation gain K of the BBPFD 110.

Figure 12:
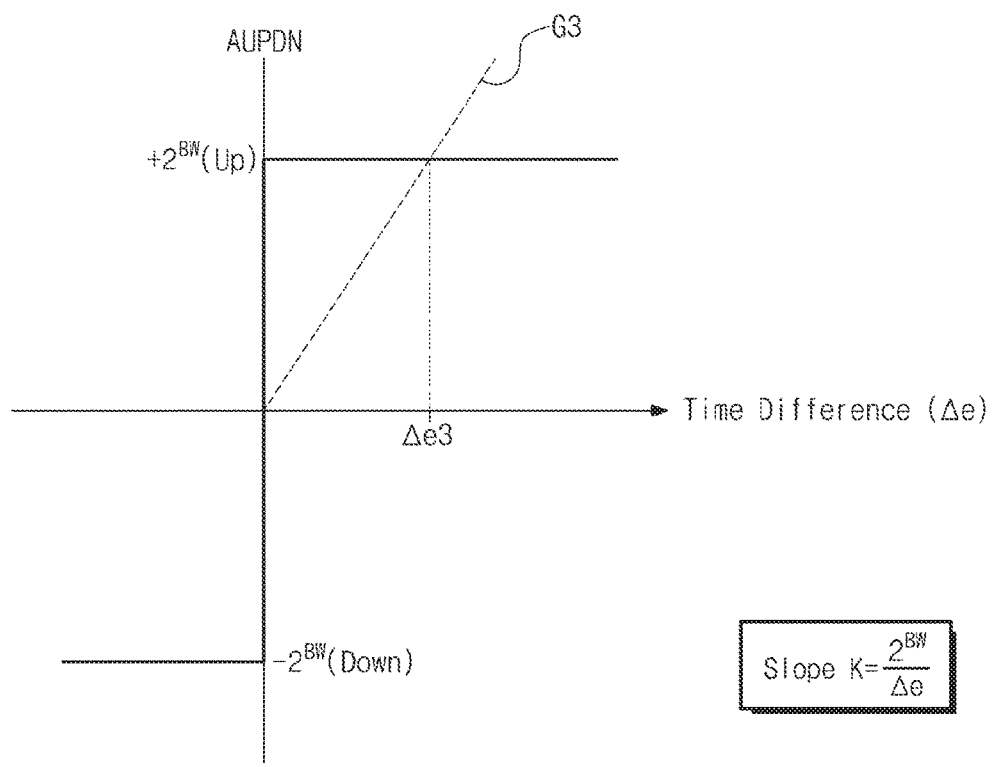
FIG. 12 is a graph for describing that a bandwidth calibrator compensates for a characteristic of a bang-bang phase frequency detector in FIG. 2.

FIG. 12 is a graph for describing that the bandwidth calibrator 130 compensates for a characteristic of the BBPFD 110 in FIG. 2.

A horizontal axis of the graph of FIG. 12 may denote a time difference Δe between a time point where the reference signal RS is received in the BBPFD 110 and a time point where the fed-back signal FS is received in the BBPFD 110. A vertical axis of the graph may denote a logic value of the amplified detection value AUPDN which is generated by the bandwidth calibrator 130. FIG. 12 illustrates that the amplified detection value AUPDN has values of "$+2^{BW}$", and "$-2^{BW}$" as the first logic value and the second logic value, but it should be understood that these values are not contradictory to the logic values illustrated in FIG. 11 and are just provided as an example to describe a characteristic of the BBPFD 110.

For example, when the time difference Δe is "Δe3", a graph G3 may be drawn from the origin. In this example, the operation gain K of the BBPFD 110 may correspond to "$2^{BW}/Δe3$". As described above, the time difference Δe may be affected by various factors (e.g., PVT variation), and a value of "Δe3" may vary. This may affect the operation gain K of the BBPFD 110.

Meanwhile, the gain value $2^{BW}$ of the digital gain for the detection value UPDN may be adjustable, and may be adjusted to compensate for variation of the time difference Δe. Accordingly, adjusting the gain value $2^{BW}$ may make the operation gain K of the BBPFD 110 uniform, and thus the bandwidth of the DPLL circuit 100 may be maintained uniformly.

Figure 13:
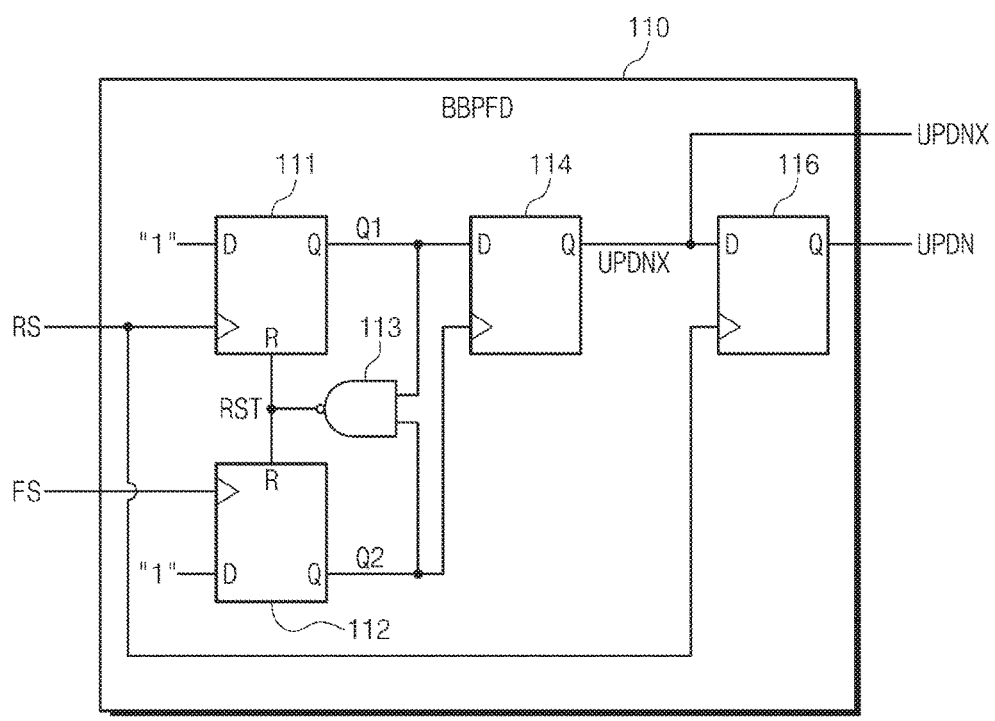
FIG. 13 is a block diagram illustrating an example configuration of a bang-bang phase frequency detector of FIG. 2.

FIG. 13 is a block diagram illustrating an example configuration of the BBPFD 110 of FIG. 2.

The BBPFD 110 may generate the detection values UPDN and UPDNX based on the reference signal RS and the fed-back signal FS. In some example embodiments, the BBPFD 110 may include logic circuits 111, 112, 113, 114, and 116. For example, each of the logic circuits 111, 112, 114, and 116 may include a flip-flop circuit, and the logic circuit 113 may include a NAND gate circuit.

The logic circuit 111 may output logic "1" as an output Q1. The logic circuit 111 may operate in response to the reference signal RS. Accordingly, the logic circuit 111 may output the output Q1 in response to the reference signal RS (e.g., in response to a rising edge of the reference signal RS).

The logic circuit 112 may output logic "1" as an output Q2. The logic circuit 112 may operate in response to the fed-back signal FS. Accordingly, the logic circuit 112 may output the output Q2 in response to the fed-back signal FS (e.g., in response to a rising edge of the fed-back signal FS).

The logic circuit 113 may output a reset signal RST based on the outputs Q1 and Q2. The reset signal RST may be generated to reset states of the logic circuits 111 and 112.

For example, when both the outputs Q1 and Q2 are logic "1", the reset signal RST may be generated. That is, when both the reference signal RS and the fed-back signal FS rise to logic "1", the reset signal RST may be generated. Accordingly, after both the reference signal RS and the fed-back signal FS rise to logic "1", states of the logic circuits 111 and 112 may be reset. When the states of the logic circuits 111 and 112 are reset, the outputs Q1 and Q2 may become logic "0".

The logic circuit 114 may output the output Q1 as the detection value UPDNX. The logic circuit 114 may operate in response to the output Q2. Accordingly, the logic circuit 114 may generate the detection value UPDNX from the output Q1 in response to the output Q2 (e.g., in response to a rising edge of the output Q2).

While the outputs Q1 and Q2 maintain logic "0" (i.e., while the states of the logic circuits 111 and 112 are reset), the BBPFD 110 may receive the reference signal RS and the fed-back signal FS. When the phase Φref of the reference signal RS lags behind the phase Φfb of the fed-back signal FS (i.e., the fed-back signal FS is faster than the reference signal RS), the output Q2 may become logic "1" earlier than the output Q1. Accordingly, the detection value UPDNX may become logic "0".

On the other hand, when the phase Φref of the reference signal RS leads the phase Φfb of the fed-back signal FS (i.e., the fed-back signal FS is slower than the reference signal RS), the output Q1 may become logic "1" earlier than the output Q2. After the output Q1 becomes logic "1" earlier, the output Q2 may become logic "1". Accordingly, the detection value UPDNX may become logic "1". In this manner, the detection value UPDNX may be associated with the order between the phase Φref of the reference signal RS and the phase Φfb of the fed-back signal FS.

The logic circuit 116 may output the intermediate detection value UPDNX, which is output from the logic circuit 114, as the final detection value UPDN. The logic circuit 116 may operate in response to the reference signal RS. Accordingly, the logic circuit 116 may generate the final detection value UPDN from the intermediate detection value UPDNX in response to reference signal RS (e.g., in response to a rising edge of the reference signal RS). The detection values UPDN and UPDNX may be provided to the bandwidth calibrator 130. Examples of the detection values UPDN and UPDNX will be further described with reference to FIGS. 14 and 15.

FIG. 13 illustrates one of possible example embodiments of the BBPFD 110, and is not intended to limit the present disclosure. Configurations such as types and connections of logic circuits, logic values, and signal edges described with reference to FIG. 13 may be variously changed or modified to suitably generate the detection values UPDN and UPDNX based on the reference signal RS and the fed-back signal FS. However, to facilitate better understanding, the following descriptions will be provided based on the configurations which have been described with reference to FIG. 13.

Figure 14:
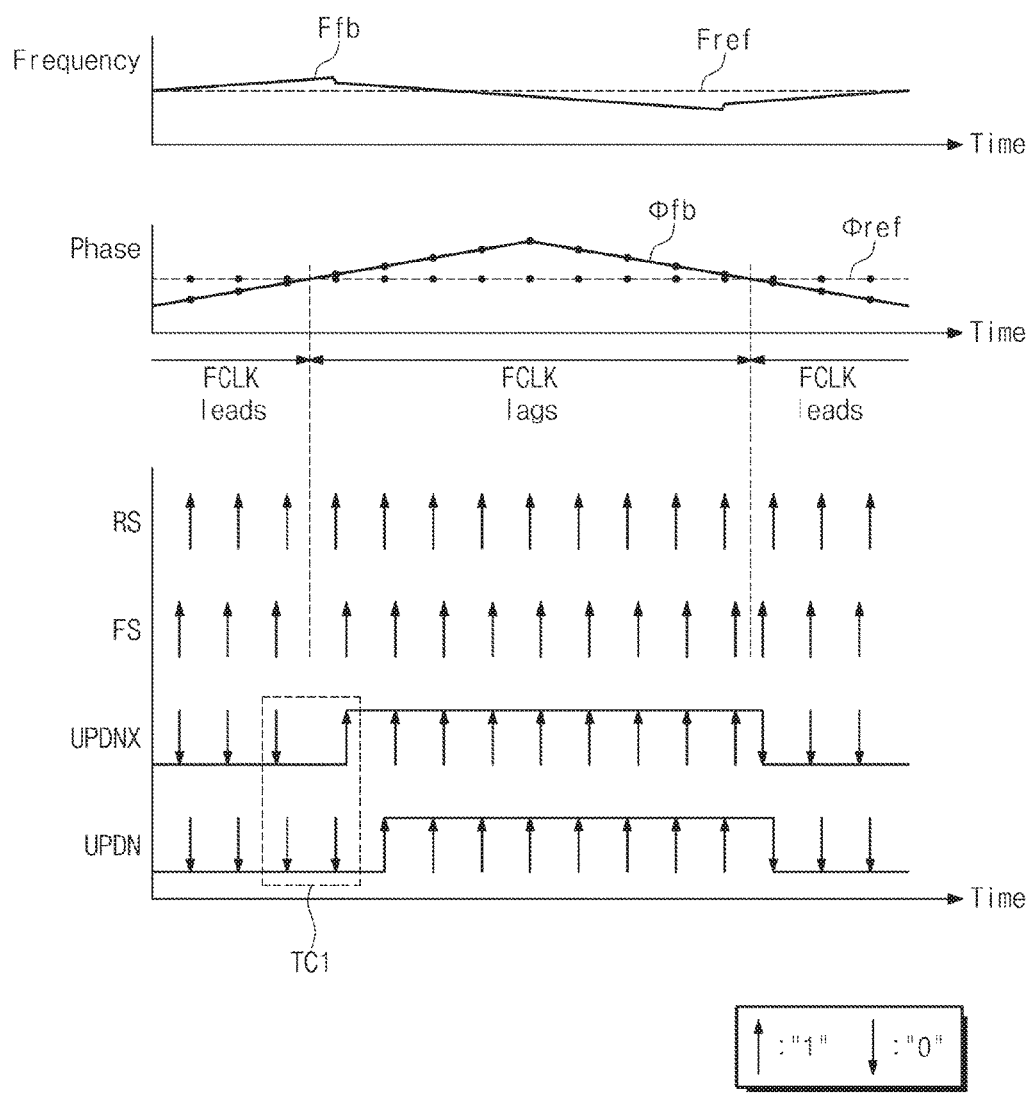
FIGS. 14 and 15 are conceptual diagrams for describing example operations of a bang-bang phase frequency detector of FIG. 13.
Figure 15:
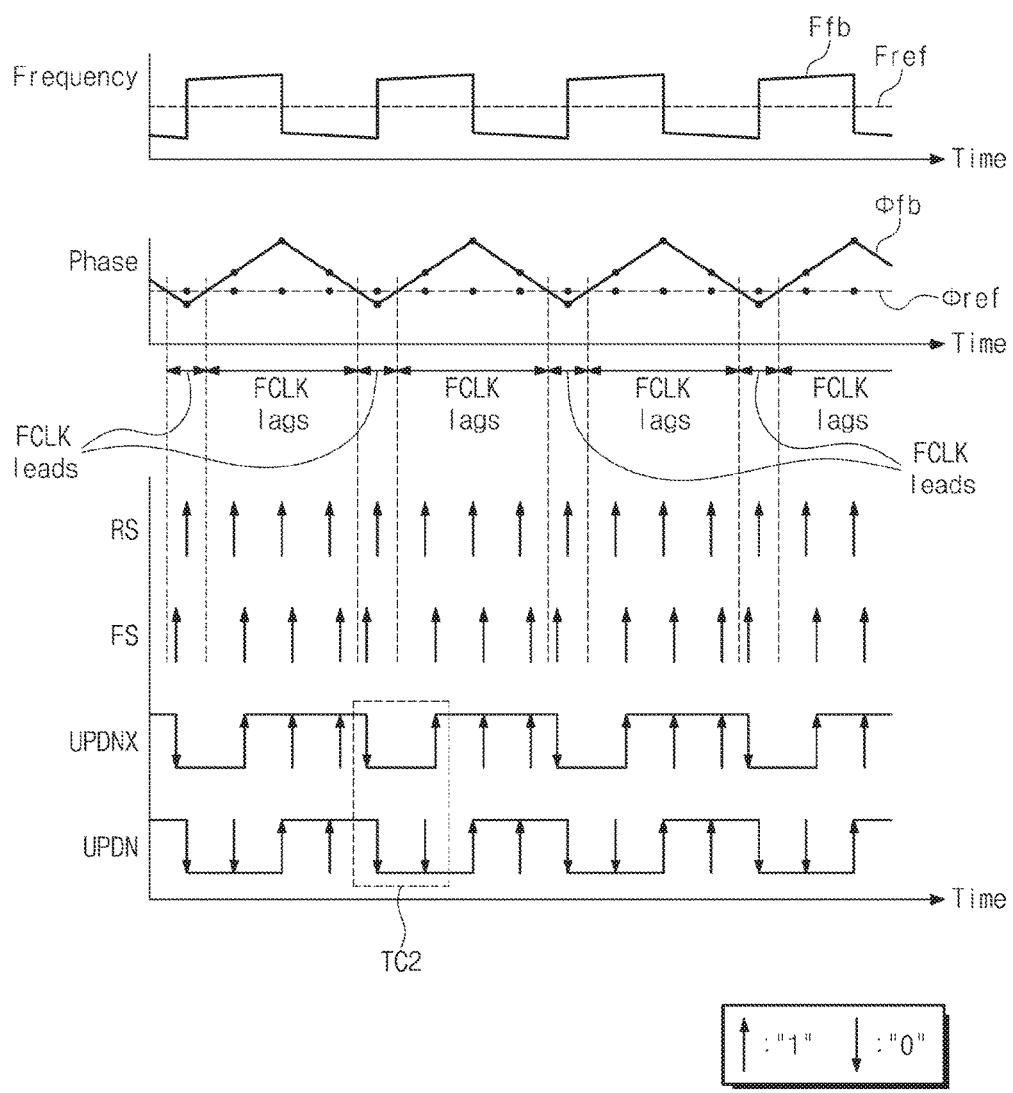

FIGS. 14 and 15 are conceptual diagrams for describing example operations of the BBPFD 110 of FIG. 13.

For example, FIG. 14 illustrates a case where an amount of variation of the frequency Ffb of the fed-back signal FS is relatively small after the phase Φfb and the frequency Ffb of the fed-back signal FS are locked within a specific range. For example, FIG. 15 illustrates a case where an amount of variation of the frequency Ffb of the fed-back signal FS is relatively great after the phase Φfb and the frequency Ffb of the fed-back signal FS are locked within a specific range. To facilitate better understanding, FIGS. 14 and 15 will be described together.

Referring to FIGS. 14 and 15, the frequency Fref and the phase Φref of the reference signal RS may be substantially constant. On the other hand, the frequency Ffb and the phase Φfb of the fed-back signal FS may vary over time.

When the operation gain K of the BBPFD 110 is relatively low, the frequency Ffb and the phase Φfb of the fed-back signal FS may slowly vary during a long time as illustrated in FIG. 14. On the other hand, when the operation gain K of the BBPFD 110 is relatively high, the frequency Ffb and the phase Φfb of the fed-back signal FS may quickly vary during a short time as illustrated in FIG. 15.

Referring to FIGS. 14 and 15, as the phase Φfb varies, the phase Φfb may lead or lag behind the phase Φref. According to an example configuration of FIG. 13, when the phase Φfb leads the phase Φref, the detection value UPDNX may become logic "0". On the other hand, when the phase Φfb lags behind the phase Φref, the detection value UPDNX may become logic "1".

Meanwhile, during time intervals TC1 and TC2 where a logic value of the detection value UPDNX changes from a first logic value (e.g., logic "0") to a second logic value (e.g., logic "1"), a logic value of the detection value UPDN may be maintained at the first logic value (e.g., logic "0"). This is because the detection value UPDN is generated from the detection value UPDNX in response to the reference signal RS while the detection value UPDNX has the first logic value.

Afterwards, a logic value of the detection value UPDN may change from the first logic value (e.g., logic "0") to the second logic value (e.g., logic "1"), in response to a change of the logic value of the detection value UPDNX to the second logic value. The logic value of the detection value UPDNX may be maintained at the second logic value while the logic value of the detection value UPDN changes from the first logic value to the second logic value.

The detection value UPDN may have the first logic values and the second logic values substantially equally, to lock the phase Φfb and the frequency Ffb of the fed-back signal FS. Accordingly, by observing the detection value UPDN during a reference time (e.g., during a sufficiently long time after the phase Φfb and the frequency Ffb of the fed-back signal FS are locked), it can be understood that a ratio of the number of first logic values of the detection value UPDN to the number of second logic values of the detection value UPDN may converge substantially to 1:1.

With regard to the detection value UPDN, the ratio of the number of first logic values to the number of second logic values may converge to 1:1 regardless of the amount of variation of the frequency Ffb of the fed-back signal FS. On the other hand, with regard to the detection value UPDNX, a ratio of the number of first logic values to the number of second logic values may vary depending on the amount of variation of the frequency Ffb of the fed-back signal FS. Referring to the time interval TC1 of FIG. 14 and the time interval TC2 of FIG. 15, the number of second logic values of the detection value UPDNX may be more than the number of second logic values of the detection value UPDN.

Referring to FIG. 14, as the amount of variation of the frequency Ffb of the fed-back signal FS becomes smaller (e.g., becomes smaller than a first reference value), an event that a logic value of the detection value UPDNX changes from the first logic value to the second logic value may rarely occur. Accordingly, by observing the detection value UPDNX during a reference time (e.g., during a sufficiently long time), it can be understood that the ratio of the number of first logic values of the detection value UPDNX to the number of second logic values of the detection value UPDNX may converge substantially to 1:1.

On the other hand, referring to FIG. 15, as the amount of variation of the frequency Ffb of the fed-back signal FS becomes greater (e.g., becomes greater than a second reference value), an event that a logic value of the detection value UPDNX changes from the first logic value to the second logic value may frequently occur. Accordingly, by observing the detection value UPDNX during a reference time (e.g., during a sufficiently long time), it can be understood that the ratio of the number of first logic values of the detection value UPDNX to the number of second logic values of the detection value UPDNX may converge substantially to 1:N (N is a real number which is greater than 1.).

For example, FIG. 15 illustrates a case where the smallest number of cycles for phase locking is 4 (i.e., a case where phase locking is repeated for every four cycles). In this example, the detection value UPDNX may have the first logic value for every four cycles. Accordingly, during a sufficiently long time, the ratio of the number of first logic values of the detection value UPDNX to the number of second logic values of the detection value UPDNX may converge substantially to 1:3.

However, the example of FIG. 15 is provided to facilitate better understanding, and is not intended to limit the present disclosure. With regard to the detection value UPDNX, the ratio of the number of first logic values to the number of second logic values may be differently changed depending on the number of phase locking cycles.

Unlike the detection value UPDN, with regard to the detection value UPDNX, the ratio of the number of first logic values to the number of second logic values may vary depending on the amount of variation of the frequency Ffb of the fed-back signal FS. For example, as the amount of variation of the frequency Ffb becomes smaller than the first reference value, the ratio of the number of first logic values of the detection value UPDNX to the number of second logic values of the detection value UPDNX may converge substantially to 1:1. On the other hand, as the amount of variation of the frequency Ffb becomes greater than the second reference value, the ratio of the number of first logic values of the detection value UPDNX to the number of second logic values of the detection value UPDNX may converge substantially to 1:N.

Accordingly, with regard to the detection value UPDNX, the ratio of the number of first logic values to the number of second logic values may be associated with the amount of variation of the frequency Ffb of the fed-back signal FS or the operation gain K of the BBPFD 110. In addition, with regard to the detection value UPDNX, the ratio of the number of first logic values to the number of second logic values may be used as an index for monitoring the bandwidth of the DPLL circuit 100.

Meanwhile, as described above, it may be advantageous to operate the DPLL circuit 100 such that the bandwidth of the DPLL circuit 100 is not excessively low or high. Accordingly, it may be advantageous to operate the DPLL circuit 100 such that the ratio of the number of first logic values of the detection value UPDNX to the number of second logic values of the detection value UPDNX converges to 1:M, which is between 1:1 and 1:N (M is a real number between 1 and N.).

For example, as the amount of variation of the frequency Ffb converges to a third reference value between the first reference value and the second reference value, the ratio of the number of first logic values of the detection value UPDNX to the number of second logic values of the detection value UPDNX may converge to 1:M. Herein, the first reference value, the second reference value, and the third reference value may be suitably selected depending on a design and an operation of the DPLL circuit 100.

For example, in the examples of FIGS. 14 and 15, when the ratio of the number of first logic values of the detection value UPDNX to the number of second logic values of the detection value UPDNX converges to 1:2, the DPLL circuit 100 may operate such that the bandwidth of the DPLL circuit 100 is not excessively low or high. Herein, the ratio of 1:2 may be understood as a value for implementing an optimal bandwidth or a reference bandwidth of the DPLL circuit 100.

The ratio of 1:2 is just an example, and is not intended to limit the present disclosure. An optimal ratio may be changed or modified depending on a design and an operation of the DPLL circuit 100. For example, the optimal ratio may be obtained from a test, an experiment, or a simulation. However, to facilitate better understanding, the following descriptions will be provided based on the ratio of 1:2.

Figure 16:
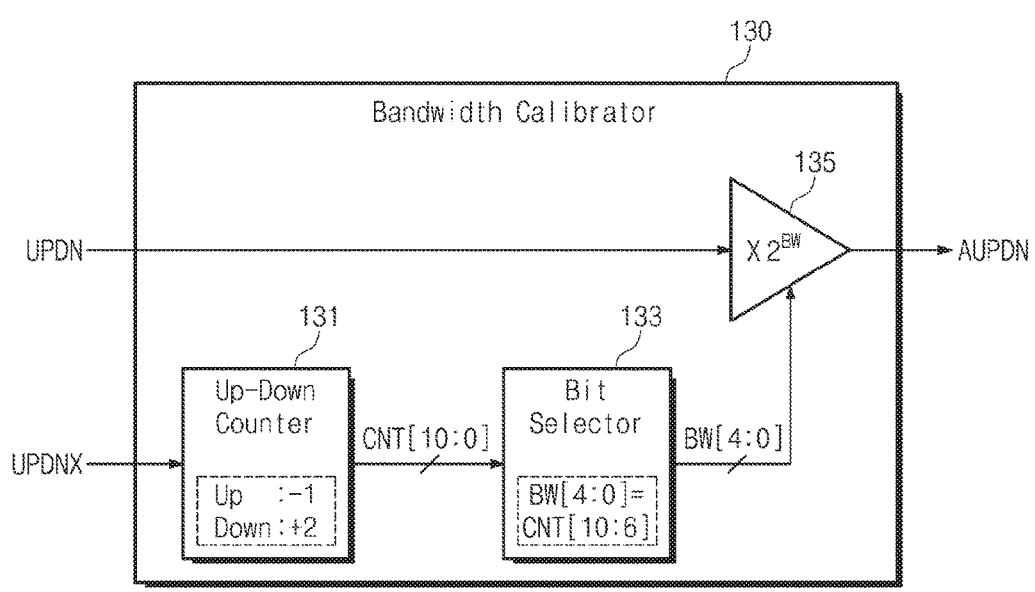
FIG. 16 is a block diagram illustrating an example configuration of a bandwidth calibrator of FIG. 2.

FIG. 16 is a block diagram illustrating an example configuration of the bandwidth calibrator 130 of FIG. 2.

The bandwidth calibrator 130 may generate the amplified detection value AUPDN based on the detection values UPDN and UPDNX. In some example embodiments, the bandwidth calibrator 130 may include an up-down counter 131, a bit selector 133, and the amplifier 135. Each of the up-down counter 131, the bit selector 133, and the amplifier 135 may include one or more logic circuits which are configured to perform operations that are to be described below.

For example, the up-down counter 131 may include a counter circuit. The up-down counter 131 may output a count value CNT[10:0]. The up-down counter 131 may increase or decrease the count value CNT[10:0] according to a received logic value. Herein, the 11-bit count value CNT[10:0] is provided as an example, but the present disclosure is not limited thereto. A length of a bit string of the count value may be changed or modified depending on a design of the bandwidth calibrator 130.

The up-down counter 131 may receive the detection value UPDNX. The up-down counter 131 may output the count value CNT[10:0] based on a logic value of the detection value UPDNX. The count value CNT[10:0] may increase or decrease based on the logic value of the detection value UPDNX.

For example, the count value CNT[10:0] may increase by an increment in response to the first logic value (e.g., logic "0") of the detection value UPDNX. For example, the count value CNT[10:0] may decrease by a decrement in response to the second logic value (e.g., logic "1") of the detection value UPDNX. The increment may be different from the decrement. For example, the up-down counter 131 may perform an asymmetrical count operation.

For example, the up-down counter 131 may increase the count value CNT[10:0] by two (2) in response to logic "0" of the detection value UPDNX. On the other hand, the up-down counter 131 may decrease the count value CNT[10:0] by one (1) in response to logic "1" of the detection value UPDNX.

As described above, when the ratio of the number of first logic values of the detection value UPDNX to the number of second logic values of the detection value UPDNX converges to 1:2, the DPLL circuit 100 may operate such that the bandwidth of the DPLL circuit 100 is not excessively low or high. Taking into account the ratio of 1:2, "2" may be selected as the increment, and "1" may be selected as the decrement. The selected increment and decrement may bring substantially the same effect as an event that the ratio of the number of first logic values of the detection value UPDNX to the number of second logic values of the detection value UPDNX converges to 1:2.

However, the increment of two and the decrement of one are just examples, and are not intended to limit the present disclosure. An operation of the up-down counter 131 may be variously changed or modified depending on an optimal ratio which is selected with regard to the detection value UPDNX.

The bit selector 133 may receive the count value CNT[10:0]. The bit selector 133 may output a bit string BW[4:0] based on the count value CNT[10:0]. For example, the bit selector 133 may generate the bit string BW[4:0] from the reference number of upper bits CNT[10:6] which are included in a bit string of the count value CNT[10:0]. However, the upper bits CNT[10:6] and the bit string BW[4:0] are just examples, and are not intended to limit the present disclosure. The number of the upper bits and a length of the bit string may be changed or modified depending on a design of the bandwidth calibrator 130.

The amplifier 135 may receive the detection value UPDN. The amplifier 135 may amplify the signal level of the detection value UPDN by the gain value $2^{BW}$, to output the amplified detection value AUPDN. The amplifier 135 may receive the bit string BW[4:0] in association with the gain value $2^{BW}$. A value of the bit string BW[4:0] may be input to the amplifier 135, to determine the gain value $2^{BW}$.

Accordingly, the bit selector 133 may be configured to determine the gain value $2^{BW}$ based on the count value CNT[10:0]. The count value CNT[10:0] and the bit string BW[4:0] may vary based on the logic value of the detection value UPDNX, and thus the gain value $2^{BW}$ may be adjustable.

For example, the bandwidth calibrator 130 may increase the count value CNT[10:0] based on the first logic value (e.g., logic "0") of the detection value UPDNX, and thus may increase the gain value $2^{BW}$. On the other hand, the bandwidth calibrator 130 may decrease the count value CNT[10:0] based on the second logic value (e.g., logic "1") of the detection value UPDNX, and thus may decrease the gain value $2^{BW}$.

When the bandwidth of the DPLL circuit 100 is great, the number of second logic values may be more than the number of first logic values in the detection value UPDNX. Meanwhile, when the bandwidth of the DPLL circuit 100 is high, it may be required to decrease the gain value $2^{BW}$. Accordingly, the up-down counter 131 may decrease the count value CNT[10:0] based on the second logic values of the detection value UPDNX. On the other hand, when the bandwidth of the DPLL circuit 100 is low, it may be required to increase the gain value $2^{BW}$. Accordingly, the up-down counter 131 may increase the count value CNT[10:0] based on the first logic values of the detection value UPDNX.

Figure 17:
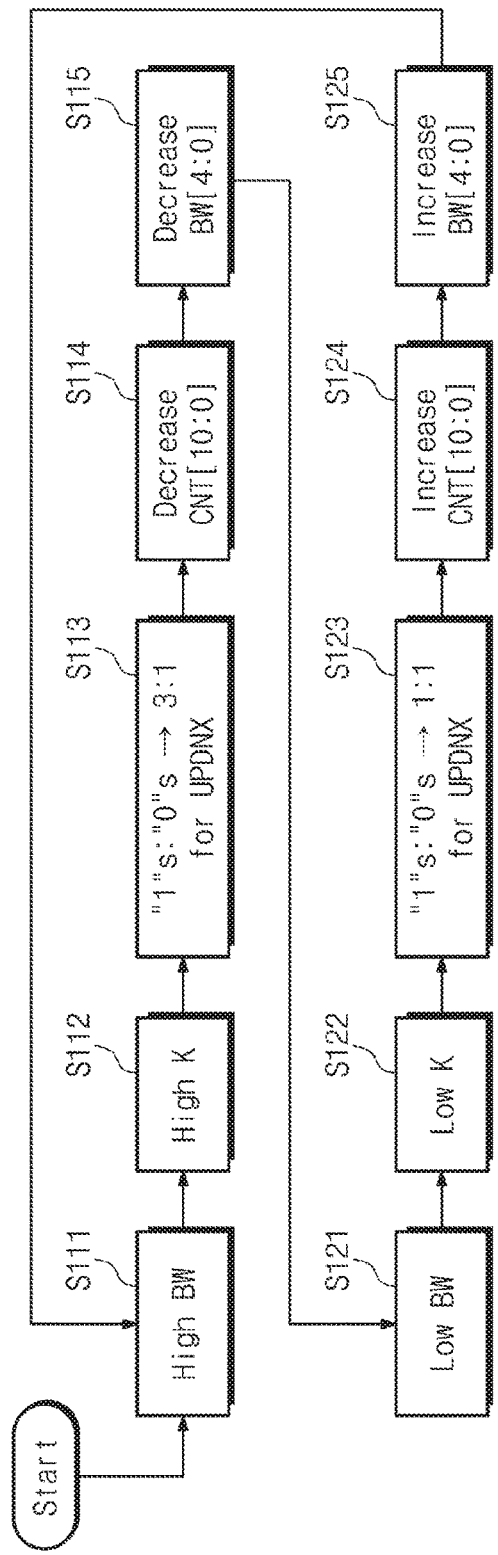
FIG. 17 is a conceptual diagram describing an example operation of a bandwidth calibrator of FIG. 16.

FIG. 17 is a conceptual diagram describing an example operation of the bandwidth calibrator 130 of FIG. 16.

In some cases, the bandwidth of the DPLL circuit 100 may be high (S111). As described above, a high bandwidth of the DPLL circuit 100 may be due to a high operation gain K of the BBPFD 110 (S112). In these cases, the ratio of the number of first logic values of the detection value UPDNX to the number of second logic values of the detection value UPDNX may converge to 1:3 (S113).

When the bandwidth of the DPLL circuit 100 is high, the bandwidth calibrator 130 may decrease the count value CNT[10:0] (S114). When the count value CNT[10:0] decreases, the value of the bit string BW[4:0] may also decrease (S115). Accordingly, the gain value $2^{BW}$ of the amplifier 135 may decrease, and the bandwidth of the DPLL circuit 100 may decrease.

In some cases, the bandwidth of the DPLL circuit 100 may be low (S121). As described above, a low bandwidth of the DPLL circuit 100 may be due to a low operation gain K of the BBPFD 110 (S122). In these cases, the ratio of the number of first logic values of the detection value UPDNX to the number of second logic values of the detection value UPDNX may converge to 1:1 (S123).

When the bandwidth of the DPLL circuit 100 is low, the bandwidth calibrator 130 may increase the count value CNT[10:0] (S124). When the count value CNT[10:0] increases, the value of the bit string BW[4:0] may also increase (S125). Accordingly, the gain value $2^{BW}$ of the amplifier 135 may increase, and the bandwidth of the DPLL circuit 100 may increase.

As a result, the gain value $2^{BW}$ of the amplifier 135 may decrease as the amount of variation of the frequency Ffb of the fed-back signal FS increases and the bandwidth of the DPLL circuit 100 becomes higher. On the other hand, the gain value $2^{BW}$ of the amplifier 135 may increase as the amount of variation of the frequency Ffb of the fed-back signal FS decreases and the bandwidth of the DPLL circuit 100 becomes lower.

In this manner, the adjustable gain value $2^{BW}$ of the amplifier 135 may compensate for variation of the operation gain K of the BBPFD 110. Accordingly, even though the time difference Δe between a time point where the reference signal RS is received in the BBPFD 110 and a time point where the fed-back signal FS is received in the BBPFD 110 varies due to various factors (e.g., PVT variation), an overall bandwidth of the DPLL circuit 100 may be maintained uniformly. This may allow the DPLL circuit 100 to operate reliably and stably.

Figures 18, 19:
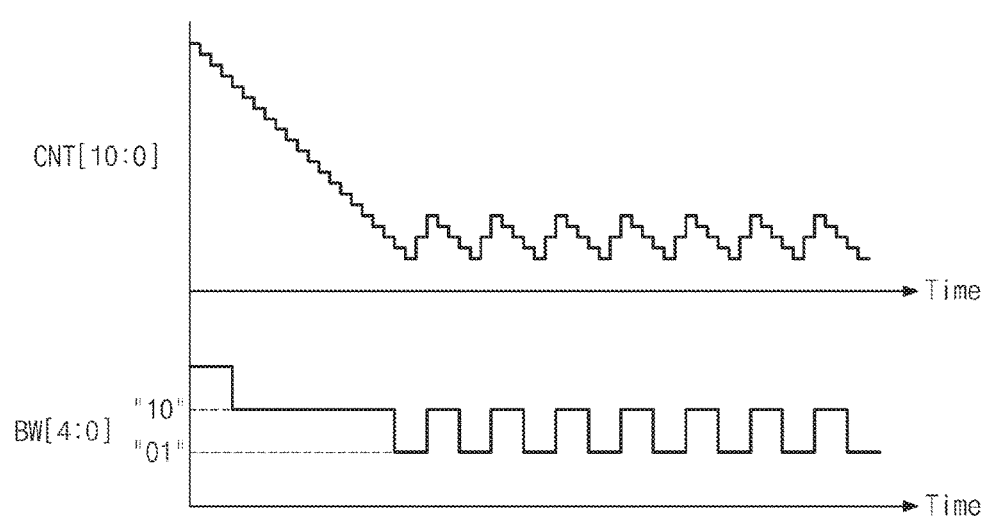
FIG. 18 is a table for describing an example operation of a bandwidth calibrator of FIG. 16.
FIG. 19 is a conceptual diagram for describing an example operation of a bandwidth calibrator of FIG. 16.

FIG. 18 is a table for describing an example operation of the bandwidth calibrator 130 of FIG. 16. FIG. 19 is a conceptual diagram for describing an example operation of the bandwidth calibrator 130 of FIG. 16. To facilitate better understanding, FIGS. 18 to 19 will be described together.

FIG. 18 illustrates the 11-bit count value CNT[10:0] and the bit string BW[4:0] which is generated from upper bits of the count value CNT[10:0]. When the count value CNT[10:0] is changed, the bit string BW[4:0] may also be changed (e.g., from "01" to "10").

FIG. 19 illustrates variation of the count value CNT[10:0] and the bit string BW[4:0]. While the count value CNT[10:0] varies between several values, the value of the bit string BW[4:0] may vary between "01" and "10".

As can be understood from FIGS. 18 and 19, the bit string BW[4:0] may not be constant, but it may vary continuously. Therefore, the gain value $2^{BW}$ of the amplifier 135 may also vary. For example, when the value of the bit string BW[4:0] varies between "01" and "10", the gain value $2^{BW}$ of the amplifier 135 may vary between "2 (=$2^1$)" and "4 (=$2^2$)".

Accordingly, by observing the gain value $2^{BW}$ in average during a sufficiently long time, it can be understood that the gain value $2^{BW}$ may be regarded as having a value between "2" and "4". Even though the gain value $2^{BW}$ is employed in a form of an exponent of 2, the gain value $2^{BW}$ may be implemented to have a value which is not expressed by an exponent of 2. Such a characteristic may make it possible to adjust the gain value $2^{BW}$ finely.

However, the value of the bit string BW[4:0] and the gain value $2^{BW}$ described with reference to FIGS. 18 and 19 are provided to facilitate better understanding, and are not intended to limit of the present disclosure. The value of the bit string BW[4:0] and the gain value $2^{BW}$ may be variously changed or modified depending on an operation of the DPLL circuit 100.

Figure 20:
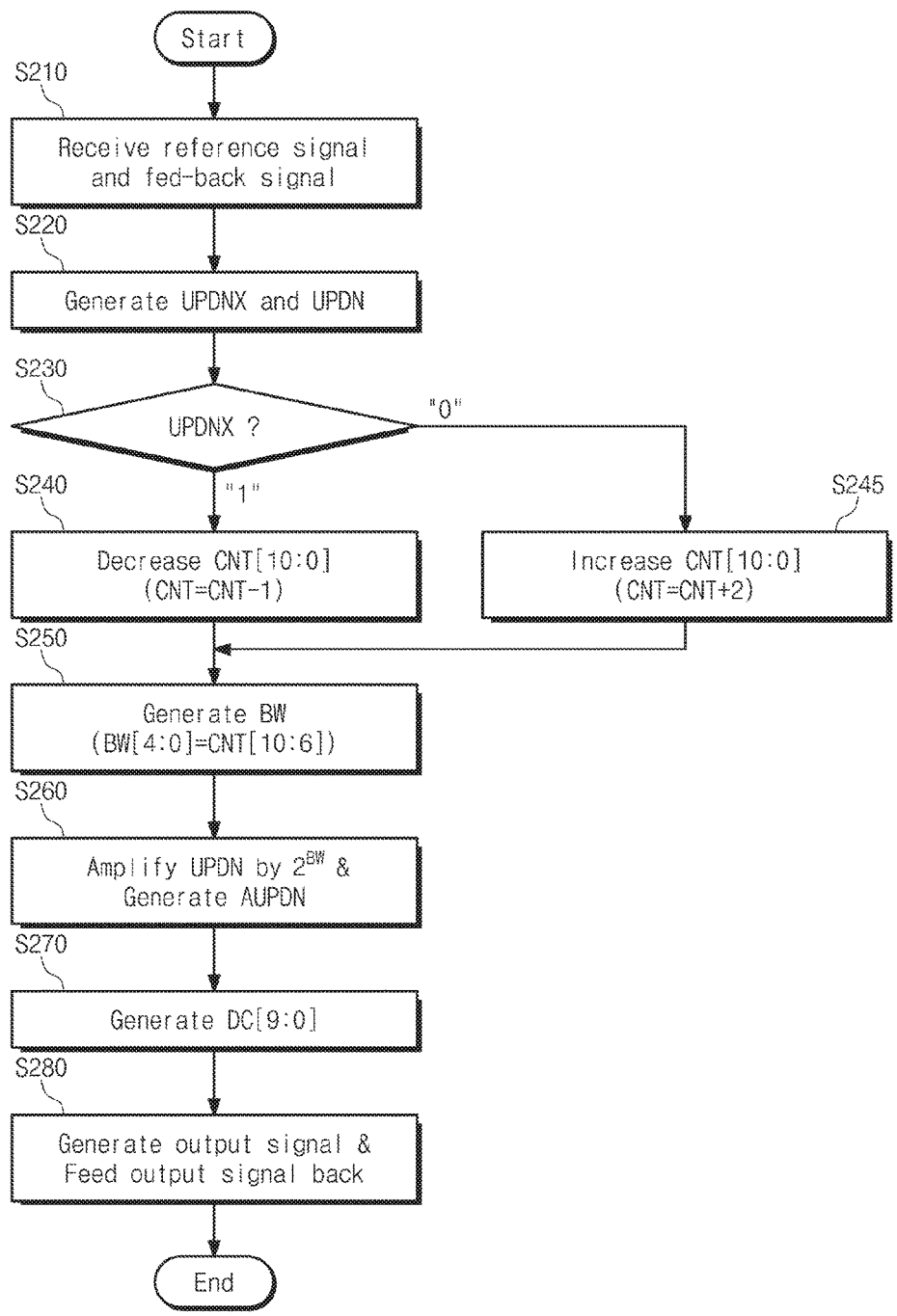
FIG. 20 is a flowchart describing an example operation of a digital phase locked loop circuit of FIG. 2.

FIG. 20 is a flowchart describing an example operation of the DPLL circuit 100 of FIG. 2.

The BBPFD 110 may receive the reference signal RS and the fed-back signal FS (S210). The BBPFD 110 may generate the detection value UPDNX based on the reference signal RS and the fed-back signal FS, and may generate the detection value UPDN from the detection value UPDNX (S220).

The bandwidth calibrator 130 may adjust the gain value $2^{BW}$ of the amplifier 135 for the detection value UPDN, based on the detection value UPDNX. To this end, the bandwidth calibrator 130 may operate in response to a first logic value (e.g., logic "0") and a second logic value (e.g., logic "1") of the detection value UPDNX (S230).

When a logic value of the detection value UPDNX is the second logic value, the bandwidth calibrator 130 may decrease the count value CNT[10:0] (S240). For example, the count value CNT[10:0] may decrease by a decrement of "1". On the other hand, when a logic value of the detection value UPDNX is the first logic value, the bandwidth calibrator 130 may increase the count value CNT[10:0] (S245). For example, the count value CNT[10:0] may increase by an increment of "2".

The bandwidth calibrator 130 may generate the bit string BW[4:0] based on the count value CNT[10:0] (S250). For example, the bit string BW[4:0] may be generated from the reference number of upper bits which are included in the count value [10:0]. Afterwards, the bandwidth calibrator 130 may amplify the signal level of the detection value UPDN by the gain value $2^{BW}$ which is determined based on the bit string BW[4:0], and thus may generate the amplified detection value AUPDN (S260).

The DLF 150 may generate the digital code DC[9:0] based on the amplified detection value AUPDN (S270). The DCO 170 may generate the output signal OS based on the digital code DC[9:0]. The output signal OS may be fed back to the BBPFD 110.

While some example embodiments have been described, it will be apparent to those skilled in the art that various changes and modifications may be made without departing from the spirit and scope of the present disclosure. Therefore, it should be understood that the above example embodiments are not limiting, but illustrative.

What is claimed is:

1. A digital phase locked loop circuit comprising:
    a phase frequency detector configured to,
        generate a first detection value associated with order between a first phase of a reference signal and a second phase of a fed-back signal, and
        generate a second detection value based on the first detection value in response to the reference signal;
    a bandwidth calibrator configured to,
        amplify a signal level of the second detection value by a gain value, to generate an amplified detection value, and
        adjust the gain value based on the first detection value;
    a digital loop filter configured to generate a digital code based on the amplified detection value; and
    a digital controlled oscillator configured to generate an output signal which has a frequency corresponding to the digital code, wherein
        the fed-back signal is generated based on the output signal and is fed back to the phase frequency detector.

2. The digital phase locked loop circuit of claim 1, wherein:
    when the first phase lags behind the second phase, the first detection value has a first logic value, and
    when the first phase leads the second phase, the first detection value has a second logic value.

3. The digital phase locked loop circuit of claim 1, wherein the phase frequency detector comprises:
    a first logic circuit configured to output a first output in response to the reference signal;
    a second logic circuit configured to output a second output in response to the fed-back signal; and
    a third logic circuit configured to generate the first output as the first detection value in response to the second output.

4. The digital phase locked loop circuit of claim 3, wherein the phase frequency detector further comprises:
    a fourth logic circuit configured to output a reset signal based on the first output and the second output, such that states of the first logic circuit and the second logic circuit are reset; and
    a fifth logic circuit configured to generate the first detection value, which is output from the third logic circuit, as the second detection value in response to the reference signal.

5. The digital phase locked loop circuit of claim 1, wherein:
    while a logic value of the first detection value changes from a first logic value to a second logic value, a logic value of the second detection value is maintained at the first logic value.

6. The digital phase locked loop circuit of claim 5, wherein:
    the logic value of the second detection value changes from the first logic value to the second logic value in response the logic value of the first detection value being changed to the second logic value.

7. The digital phase locked loop circuit of claim 6, wherein:
    while the logic value of the second detection value changes from the first logic value to the second logic value, the logic value of the first detection value is maintained at the second logic value.

8. The digital phase locked loop circuit of claim 1, wherein:
    as an amount of variation of a frequency of the fed-back signal becomes less than a first reference value, a ratio of a number of first logic values of the first detection value to a number of second logic values of the first detection value converges to 1:1 for a first reference time, and
    as the amount of variation of the frequency of the fed-back signal becomes greater than a second reference value, the ratio of the number of first logic values of the first detection value to the number of second logic values of the first detection value converges to 1:N for a second reference time, N being a real number which is greater than 1.

9. The digital phase locked loop circuit of claim 8, wherein:
    as the amount of variation of the frequency of the fed-back signal converges closer to a third reference value between the first reference value and the second reference value, the ratio of the number of first logic values of the first detection value to the number of second logic values of the first detection value converges to 1:M for a third reference time, M being a real number between 1 and N.

10. The digital phase locked loop circuit of claim 1, wherein:
    a ratio of a number of first logic values of the second detection value to a number of second logic values of the second detection value converges to 1:1, regardless of an amount of variation of a frequency of the fed-back signal.

11. A digital phase locked loop circuit comprising:
    a phase frequency detector configured to generate a first detection value and a second detection value, each of the first detection value and the second detection value being associated with order between a phase of a reference signal and a phase of a fed-back signal;
    a bandwidth calibrator configured to,
        amplify a signal level of the second detection value by a gain value to generate an amplified detection value such that the bandwidth calibrator increases the gain value in response to the first detection value being a first logic value and decreases the gain value in response to the first detection value being a second logic value, and
        adjust the gain value based on the first detection value; and
    a digital controlled oscillator configured to generate an output signal having a frequency which is associated with the amplified detection value, wherein the fed-back signal is generated based on the output signal and is fed back to the phase frequency detector.

12. The digital phase locked loop circuit of claim 11, wherein the bandwidth calibrator comprises:
a counter configured to output a count value which increases and decreases based on a logic value of the first detection value; and
a bit selector configured to determine the gain value based on the count value.

13. The digital phase locked loop circuit of claim 12, wherein:
the first detection value has one of the first logic value and the second logic value,
the count value increases by an increment in response to the first logic value of the first detection value, and
the count value decreases by a decrement in response to the second logic value of the first detection value.

14. The digital phase locked loop circuit of claim 12, wherein the bit selector is further configured to:
generate a first bit string which is associated with the gain value, the first bit string being generated from a reference number of upper bits which are included in a second bit string of the count value.

15. The digital phase locked loop circuit of claim 14, wherein the bandwidth calibrator further comprises:
an amplifier configured to amplify the signal level of the second detection value by the gain value which is determined based on the first bit string, to output the amplified detection value.

16. A digital phase locked loop circuit comprising:
a phase frequency detector configured to generate a first detection value and a second detection value, each of the first detection value and the second detection value being associated with order between a phase of a reference signal and a phase of a fed-back signal;
a bandwidth calibrator configured to,
amplify a signal level of the second detection value by a gain value, to generate an amplified detection value, and
increase and decrease the gain value in response respectively to a first logic value and a second logic value of the first detection value; and
a digital controlled oscillator configured to generate an output signal having a frequency which is associated with the amplified detection value, wherein,
as an amount of variation of a frequency of the fed-back signal becomes greater than a reference value, a ratio of a number of first logic values of the first detection value to a number of second logic values of the first detection value converges to 1:M for a first reference time, M being a real number which is greater than 1.

17. The digital phase locked loop circuit of claim 16, wherein:
a ratio of the number of first logic values of the second detection value to the number of second logic values of the second detection value converges to 1:1 for a second reference time.

18. The digital phase locked loop circuit of claim 16, wherein:
the gain value decreases as the amount of variation of the frequency of the fed-back signal increases, and
the gain value increases as the amount of variation of the frequency of the fed-back signal decreases.

19. The digital phase locked loop circuit of claim 16, wherein:
the fed-back signal is generated based on the output signal and is fed back to the phase frequency detector.

20. The digital phase locked loop circuit of claim 13, wherein the increment is different from the decrement.

* * * * *